United States Patent
Park et al.

(10) Patent No.: US 7,960,500 B2
(45) Date of Patent: Jun. 14, 2011

(54) BLUE ELECTROLUMINESCENT POLYMER, METHOD OF PREPARING BLUE ELECTROLUMINESCENT POLYMER, AND ORGANIC ELECTROLUMINESCENT DEVICE EMPLOYING THE SAME

(75) Inventors: Sang-Hoon Park, Seongnam-si (KR); Yu-Jin Kim, Suwon-si (KR); Jong-Jin Park, Yongin-si (KR); Jhun-Mo Son, Yongin-si (KR); Young-Mok Son, Hwaseong-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1231 days.

(21) Appl. No.: 11/580,858

(22) Filed: Oct. 16, 2006

(65) Prior Publication Data

US 2007/0155952 A1    Jul. 5, 2007

(30) Foreign Application Priority Data

Jan. 3, 2006    (KR) .................. 10-2006-0000466

(51) Int. Cl.
  *H01L 51/54* (2006.01)
(52) U.S. Cl. ........ 528/423; 528/377; 528/380; 528/425; 257/E51.036; 257/40; 428/690; 428/917; 313/504; 313/506
(58) Field of Classification Search .................. 428/690, 428/917; 528/423, 377, 380, 425; 313/504, 313/506
See application file for complete search history.

(56) References Cited

U.S. PATENT DOCUMENTS 5,777,070 A * 7/1998 Inbasekaran et al. ......... 528/394
2004/0072989 A1* 4/2004 Son et al. ..................... 528/397

FOREIGN PATENT DOCUMENTS

| CN | 1276806 A |   | 12/2000 |
| CN | 1483783 A |   | 3/2004 |
| JP | 63244042 A | * | 10/1988 |

OTHER PUBLICATIONS

Chinese Office Action issued by the Chinese Patent Office dated Jul. 30, 2010, Application No. 200610136109.3 together with Request for Entry.

* cited by examiner

*Primary Examiner* — D. Lawrence Tarazano
*Assistant Examiner* — J. L. Yang
(74) *Attorney, Agent, or Firm* — Robert E. Bushnell, Esq.

(57) ABSTRACT

Provided are a blue electroluminescent (EL) polymer, a method of manufacturing the same, and an organic EL device including the polymer as a light emitting component, wherein an acridine derivative which can transport holes is introduced into a polymer backbone. The polymer is represented by Formula 1:

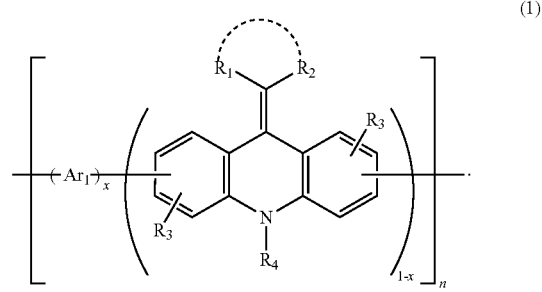

The blue EL polymer has high color purity and color stability.

20 Claims, 4 Drawing Sheets

BLUE ELECTROLUMINESCENT POLYMER, METHOD OF PREPARING BLUE ELECTROLUMINESCENT POLYMER, AND ORGANIC ELECTROLUMINESCENT DEVICE EMPLOYING THE SAME

CROSS-REFERENCE TO RELATED PATENT APPLICATION AND CLAIM OF PRIORITY

This application claims the benefit of Korean Patent Application No. 10-2006-0000466, filed on Jan. 3, 2006 in the Korean Intellectual Property Office, the disclosure of which is incorporated herein in its entirety by reference.

BACKGROUND OF THE INVENTION

1. Field of the Invention

The present invention relates to a blue electroluminescent (EL) polymer, a method of preparing the blue EL polymer, and an organic EL device including the blue EL polymer, and more particularly, to a blue EL polymer, a method of preparing the blue EL polymer, and an organic EL device including the blue EL polymer with high color purity and color stability compared to a conventional blue EL polymer, the blue EL polymer being obtained by introducing an acridine derivative having a hole transporting ability to a polymer backbone.

2. Description of the Related Art

An organic electroluminescent (EL) device is an active matrix (AM) emissive display device using the principle that when current is applied to a fluorescent or phosphorescent organic compound thin layer (hereinafter referred to as 'organic layer'), electrons and holes combine in the organic layer and thus light is generated. An organic EL device can be made light, is easy to manufacture because of simple elements thereof, and can provide a wide viewing angle of a high quality image. Also, the EL device can realize perfect mobile images and high color purity and can be obtained at low power and low voltage, and thus is appropriate for mobile electronic devices.

The organic EL devices can be classified into low molecular weight organic EL devices and polymer EL devices, depending on the material forming the organic layer.

In regard to the low molecular weight organic EL devices, which can be made by a vacuum deposition method, the light emitting material thereof can be easily purified, high purity can be easily obtained, and color pixels can be easily realized. However, despite the advantages of low molecular weight organic EL devices, improvements are still needed for practical application, for example, improvement of quantum efficiency and color purity and preventing the thin layers from being crystallized.

Meanwhile, polymer EL devices can be easily manufactured at low costs by forming an organic layer by spin coating or printing, and the mechanical characteristics of the organic layer is excellent. However, the polymer EL devices also have problems such as bad color purity, high turn-on voltage, low efficiency, and short lifetime, and at the present, studies are actively being conducted to find out ways to overcome these problems.

SUMMARY OF THE INVENTION

The present invention provides an organic electroluminescent (EL) device having high color purity, high efficiency, long lifetime and operating at a low voltage. In particular, the present invention provides a blue EL polymer and an organic EL device including the blue EL device having high color purity and color stability by introducing an acridine derivative polymer which can transport holes in a polymer backbone.

According to an aspect of the present invention, there is provided a polymer as represented by Formula 1 below:

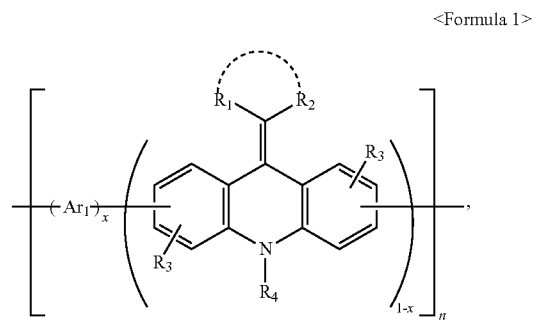

<Formula 1> where x is from 0.001 to 0.99;
n is from 10 to 150;
$Ar_1$ is a material selected from the group consisting of a substituted or unsubstituted C6-C30 arylene group, a substituted or unsubstituted C2-C30 heteroarylene group, a substituted or unsubstituted C2-C30 hetero ring group, and a substituted or unsubstituted C2-C30 vinylene group;
$R_1$ and $R_2$ are each independently H, a substituted or unsubstituted C1-C20 alkyl group, a substituted or unsubstituted C6-C30 aryl group, a substituted or unsubstituted C4-C20 cycloalkyl group, or a substituted or unsubstituted C1-C20 alkoxy group, and R1 and R2 can be connected to each other to form a ring;
$R_3$ is H, an alkyl group, an alkoxy group, an ester group, a cyano group, an aryl group, a heteroaryl group, a cyclic group, a heterocyclic group, or a fused aromatic group; and
$R_4$ is a material selected from the group consisting of H, an alkyl group, an alkoxy group, an ester group, a substituted or unsubstituted C6-C30 aryl group, a substituted or unsubstituted C2-C30 heteroaryl group, a substituted or unsubstituted C2-C30 hetero ring group, a fused aromatic group, and a triphenylamine derivative.

According to another aspect of the present invention, there is provided an organic EL device comprising an organic layer between a pair of electrodes, wherein the organic layer may include the above described polymer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
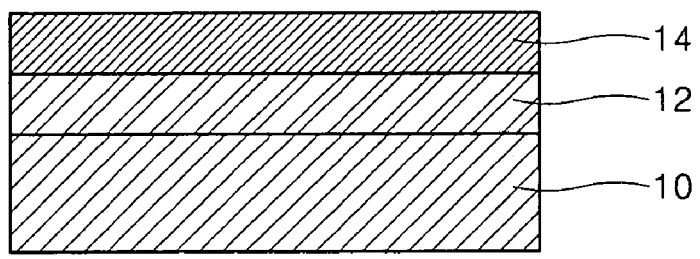
FIGS. 1A through 1F are cross-sectional views of stack structures of an organic electroluminescent (EL) device according to embodiments of the present invention.

The present invention will now be described more fully with reference to the accompanying drawings, in which exemplary embodiments of the invention are shown.

A blue electroluminescent (EL) polymer according to an embodiment of the present invention includes an acridine derivative polymer which can transport holes in a polymer backbone. In the above-described structure, the polymer according to an embodiment of the present invention shows high color purity and excellent color stability compared to a conventional blue EL polymer.

Accordingly, according to an embodiment of the present invention, a polymer represented by Formula 1 below is provided.

<Formula 1>

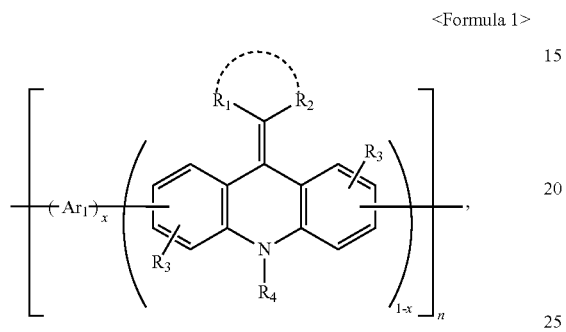

where x is from 0.001 to 0.99;

n is from 10 to 150;

$Ar_1$ is a material selected from the group consisting of a substituted or unsubstituted C6-C30 arylene group, a substituted or unsubstituted C2-C30 heteroarylene group, a substituted or unsubstituted C2-C30 hetero ring group, and a substituted or unsubstituted C2-C30 vinylene group;

$R_1$ and $R_2$ are each independently H, a substituted or unsubstituted C1-C20 alkyl group, a substituted or unsubstituted C6-C30 aryl group, a substituted or unsubstituted C4-C20 cycloalkyl group, or a substituted or unsubstituted C1-C20 alkoxy group;

$R_3$ is H, an alkyl group, an alkoxy group, an ester group, a cyano group, an aryl group, a heteroaryl group, a cyclic group, a heterocyclic group, or a fused aromatic group; and $R_4$ is a material selected from the group consisting of H, an alkyl group, an alkoxy group, an ester group, a substituted or unsubstituted C6-C30 aryl group, a substituted or unsubstituted C2-C30 heteroaryl group, a substituted or unsubstituted C2-C30 hetero ring group, a fused aromatic group, and a triphenylamine derivative.

Preferably, $Ar_1$ of Formula 1 may be one of Formulas 1A through 1R as below.

[Formula 1A]

[Formula 1B]

[Formula 1C]

[Formula 1D]

[Formula 1E]

[Formula 1F]

[Formula 1G]

[Formula 1H]

[Formula 1I]

[Formula 1J]

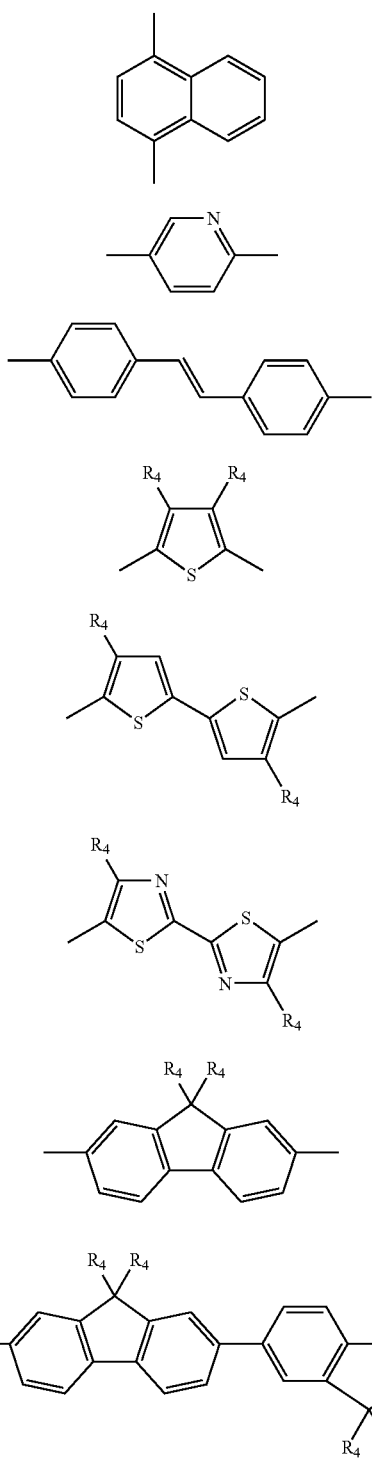

Each R₄ of Formulas 1A through 1R is selected from the group consisting of a C1-C12 alkyl group, an alkoxy group, and a substituted or unsubstituted C6-C30 aryl group.

Ar₁ of Formula 1 may be particularly a fluorene derivative or a spirofluorene derivative as in Formula 1C or 1Q because high efficiency and high color purity can be obtained by increasing thermal stability and suppressing formation of excimers with neighboring chains.

Also, when a ring is formed by $R_1$ and $R_2$ which are connected to each other in Formula 1, the ring is a substituted or unsubstituted cycloalkyl C6-C20 group and may include a hetero atom.

Examples of the unsubstituted alkyl group used in embodiments of the present invention include methyl, ethyl, propyl, isobutyl, sec-butyl, tert-butyl, pentyl, iso-amyl, hexyl, and one or more hydrogen atoms of the alkyl group can be substituted with a halogen atom, a hydroxyl group, a nitro group, a cyano group, a substituted or unsubstituted amino group (—NH₂, —NH(R), —N(R')(R"), where R' and R" are independently alkyl groups of C1-C10), an amidino group, a hydrazine group, a hydrazone group, a carboxyl group, a sulfonic acid group, a phosphoric acid group, a C1-C20 alkyl group, a C1-C20 halogenated alkyl group, a C1-C20 alkenyl group, a C1-C20 alkynyl group, a C1-C20 heteroalkyl group, a C6-C20 aryl group, a C6-C20 arylalkyl group, a C6-C20 heteroaryl group, or a C6-C20 heteroarylalkyl group.

The cycloalkyl group used in the compounds of embodiments of the present invention refers to a univalent monocyclic system. At least one or more hydrogen atoms of the cycloalkyl group can be substituted with the same substitution group as in the case of the alkyl group.

The aryl group which is used as the substitution group in the compound of the present invention refers to a carbocyclic aromatic system including one or more rings, and the rings may be attached by a pendent method or may be fused. Examples of the aryl group include aromatic groups like phenyl, naphthyl, tetrahydronaphthyl and one or more hydrogen atoms of the aryl group can be substituted with the same substitution group as in the case of the alkyl group.

Examples of the alkoxy group which is the substitution group used in the compounds of embodiments of the present invention include methoxy, ethoxy, prophoxy, isobutyloxy, sec-butyloxy, pentyloxy, iso-amyloxy, hexyloxy, etc., and one or more hydrogen atoms of the alkoxy group can be substituted with the same substitution group as in the case of the alkyl group.

The heteroaryl group used in the compounds of the embodiments of the present invention refers to a aromatic ring system, preferably C5-C30 aromatic ring system, in which one, two or three hetero atoms selected from N, O, P, or S are included, and the rest of the ring atoms are C. The rings may be attached together by a pendent method or may be fused. One or more of the hydrogen atoms in the heteroaryl group can be substituted with the same substitution group as in the case of the alkyl group.

The weight average molecular weight Mw of the blue EL polymer according to an embodiment of the present invention is an important factor regarding the thin layer forming characteristics and the lifetime of the organic EL device. In terms of this, the weight average molecular weight of the blue EL polymer may be preferably 10,000 to 2,000,000.

If the weight average molecular weight of the polymer is less than 10,000, layers are crystallized during the manufacture and the driving of the device. If the weight average molecular weight of the polymer is over 2,000,000, it is substantially difficult to manufacture the polymer in a conventional synthesis condition in which an aryl coupling reaction mediated by Pd(O) or Ni(O) is used, and it is not appropriate in terms of the luminescence of the organic EL device.

The molecular weight distribution (MWD) of the polymer according to an embodiment of the present invention may be preferably as narrow as possible because of the electroluminescence of the device, particularly, in terms of the lifetime of the device. Preferably, the MWD of the polymer of the present invention may be in the range from 1 to 5.

Preferably, the compound represented by Formula 1 may be one of Formulae 2A, 2B, 2C, and 3.

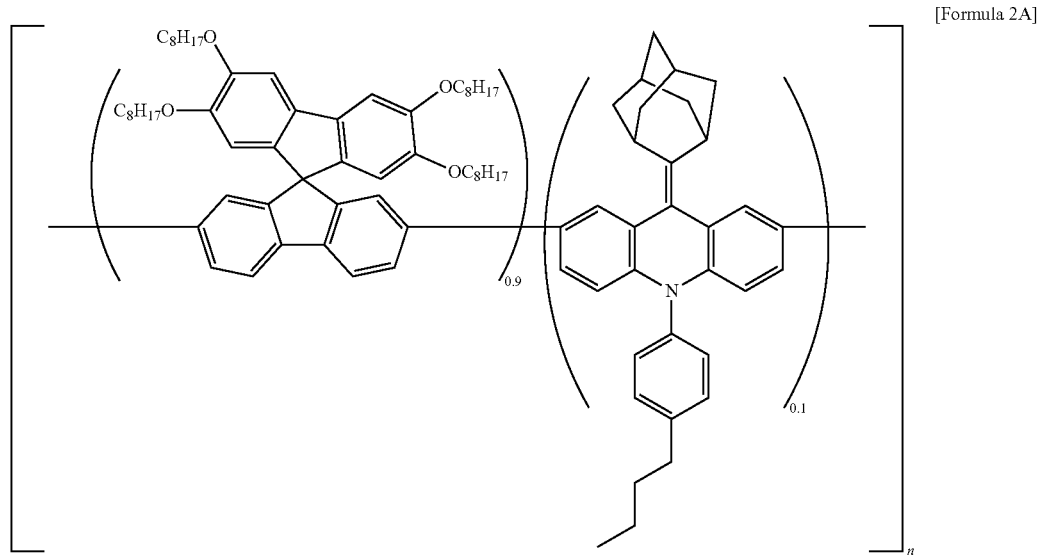
[Formula 2A]
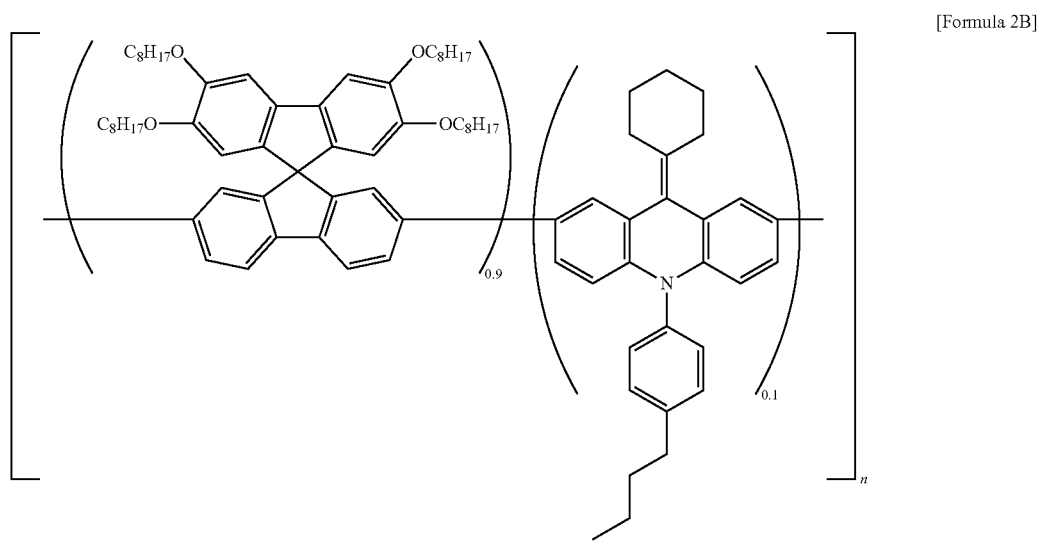
[Formula 2B]
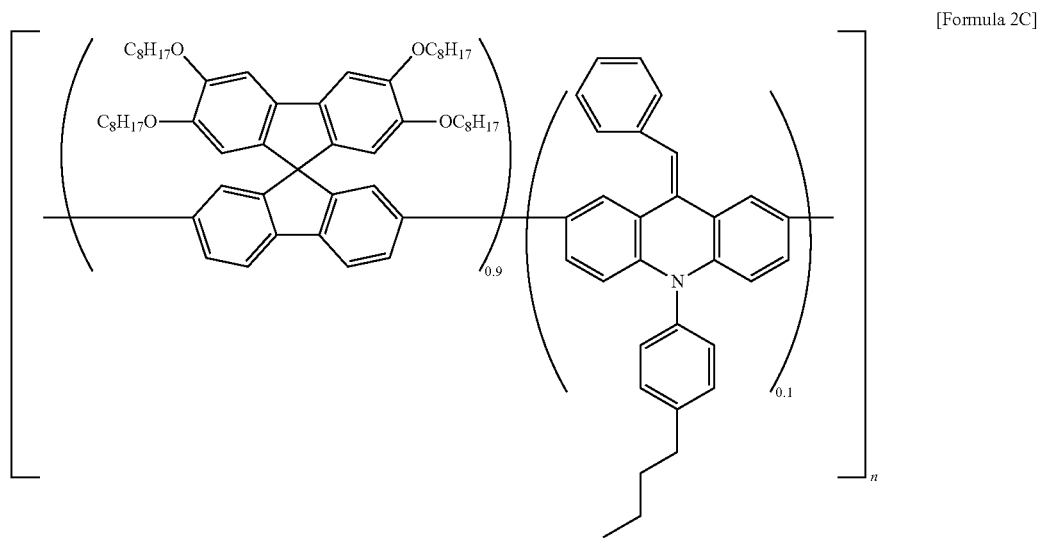
[Formula 2C]

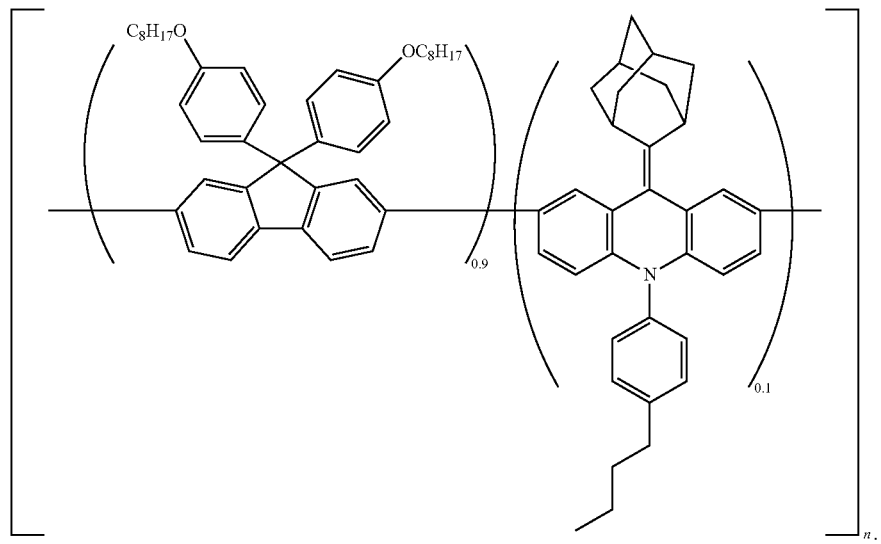

[Formula 3]

Also, according to another embodiment of the present invention, there is provided an organic EL device including an organic layer between a pair of electrodes, wherein the organic layer includes the polymer of Formula 1 above.

Hereinafter, an organic EL device employing the polymer of Formula 1 above and a method of preparing the polymer will be described.

FIGS. 1A through 1F are cross-sectional views illustrating the stack structures of the organic EL device according to embodiments of the present invention.

Referring to FIG. 1A, an emissive layer 12 including the blue EL polymer of Formula 1 is stacked on a first electrode 10, and a second electrode 14 is formed on the emissive layer 12.

Figure 1B:
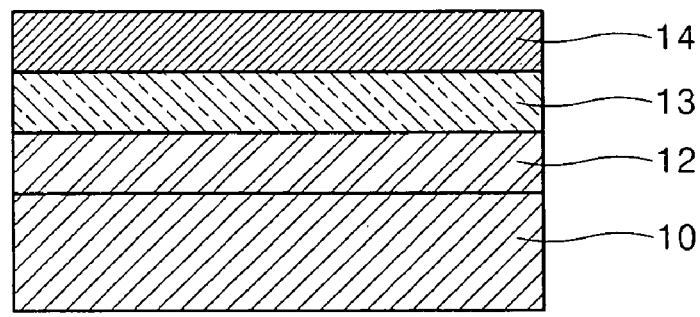

Referring to FIG. 1B, an emissive layer 12 including the blue EL polymer of Formula 1 is stacked on a first electrode 10, and a hole blocking layer (HBL) 13 is formed on the emissive layer 12, and a second electrode 14 is formed thereon.

Figure 1C:
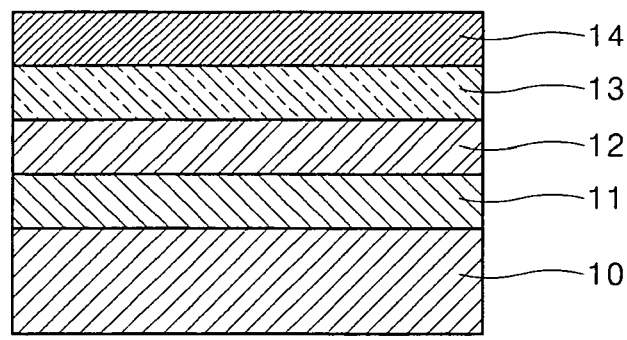

The organic EL device of FIG. 1C includes a hole injection layer (HIL) 11, which is also called a 'buffer layer', between a first electrode 10 and an emissive layer 12.

Figure 1D:
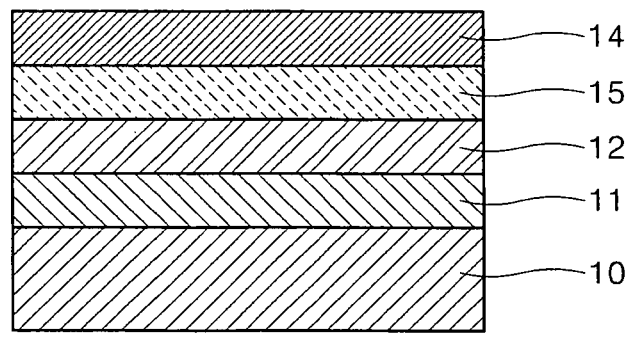

The organic EL device of FIG. 1D has the same structure as that of FIG. 1C, except that an electron transporting layer (ETL) 15 is formed instead of an HBL 13 formed on an emissive layer 12.

Figure 1E:
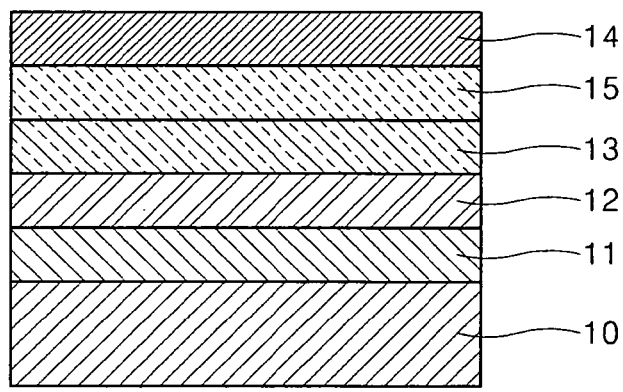

The organic EL device of FIG. 1E has the same structure as that of FIG. 1C, except that a two-layer film sequentially-formed of an HBL 13 and an ETL 15 is formed instead of an HBL 13 formed on an emissive layer 12.

Figure 1F:
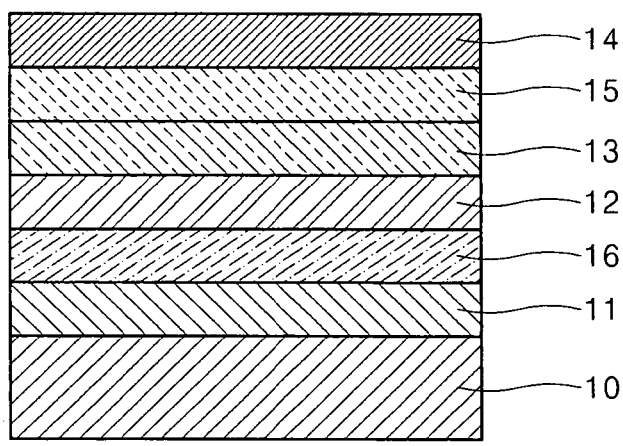

The organic EL device of FIG. 1F has the same structure as that of FIG. 1E, except that a hole transporting layer (HTL) 16 is formed further between a hole injection layer 11 and an emissive layer 12. The HTL 16 suppresses impurities from penetrating the emissive layer 12 from the HIL 11.

The organic EL device having the stack structure of FIGS. 1A through 1F can be manufactured in a conventional manner, and the manufacturing method thereof is not limited.

Hereinafter, a method of manufacturing the organic EL device according to an embodiment of the present invention will be described.

First, a first electrode 10 patterned in the upper portion of a substrate (not shown) is formed. The substrate may be a conventionally used substrate in an organic EL device and may be a glass substrate or a transparent plastic substrate which has good transparency and good surface leveling, which can be treated easily and is waterproof. The thickness of the substrate may be from 0.3 to 1.1 mm.

The material forming the first electrode 10 is not limited. If the first electrode is a cathode, the cathode is formed of an electrically conductive metal with which holes can be easily injected or an oxide thereof, and examples of the metal include indium tin oxide (ITO), indium zinc oxide (IZO), nickel (N), platinum (Pt), gold (Au) iridium (Ir), etc.

The substrate, on which first electrode 10 is formed, is cleansed and treated with UV ozone. The cleansing method uses an organic solvent such as isopropanol (IPA), acetone, etc.

A hole injection layer 11 is selectively formed on the first electrode 10 of the cleansed substrate. When a hole injection layer 11 is formed in such a manner, contact resistance of the first electrode 10 and the emissive layer 12 is reduced, and at the same time, the hole transporting ability of the first electrode 10 relative to the emissive layer 12 increases, thereby improving the turn-on voltage and the lifetime of the device. Any material commonly used in the field can be used as the material forming the hole injection layer 11. Examples of the material include PEDOT{poly(3,4-ethylenedioxythiophene)}/PSS (polystyrene parasulfonate), starbust-based material, copper phthalocyanine, polythiophene, polyaniline, polyacetylene, polypyrrole, polyphenylene vinylene, or derivatives thereof. The material as listed above is spin-coated on the first electrode 10 and dried to form a hole injection layer 11. The thickness of the hole injection layer 11 is 300 to 2,000 Å, preferably, 500, to 1,100 Å. If the thickness of the hole injection layer 11 is outside this range, the hole injection characteristics are not good. The temperature for drying is preferably 100 to 250° C.

A composition for forming an emissive layer is coated on the hole injection layer 11 and dried to form an emissive layer 12. The composition for forming an emissive layer is comprised of a polymer represented by Formula 1, preferably of 0.01 to 10% by weight and a solvent.

Any solvent that can dissolve the EL polymer can be used. Examples of the solvent include toluene, chlorobenzene, etc.

A dopant is added to the composition for forming an emissive layer in some cases. The amount of the dopant may vary depending on the material forming an emissive layer, but is generally 30-80 parts by weight to 100 parts by weight of the material forming an emissive layer (the total amount of the host and the dopant). If the amount of the dopant is outside this range, the luminescence of the EL device deteriorates. Examples of the dopant include arylamine, pheryl compound, pyrrole compound, hydrazone compound, carbazole compound, stilbene compound, starburst compound, oxadiazole compound, etc.

The thickness of the emissive layer 12 may be set to be 100-1000 Å, preferably 500 to 1000 Å, by adjusting the density of the composition for forming an emissive layer and the spin speed during spin coating. If the thickness of the emissive layer 12 is less than 100 Å, the luminescence decreases, and if over 1000 Å, the turn-on voltage increases.

A hole transporting layer 16 may be selectively formed between the hole injection layer 11 and the emissive layer 12. Any material that transports holes can be used to form a hole transporting layer, for example, polytriphenylamine. The thickness of the hole transporting layer 16 may be 100-1000 Å.

A hole blocking layer 13 and/or an electron transporting layer 15 are formed on the emissive layer 12 by deposition or spin coating. The hole blocking layer 13 blocks excitons, which are generated from the light emitting material, from moving to the electron transporting layer 15 or blocks holes from moving to the electron transporting layer 15.

The hole blocking layer 13 can be formed of LiF or MgF$_2$, phenanthrolines (e.g., BCP available from UDC), imidazoles, triazoles, oxadiazoles (e.g.: PBD), BAlq, which is an aluminum complex (available from UDC), etc. The exemplary compounds are shown below.

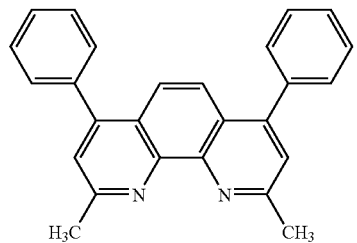

Organic compound containing phenanthroline

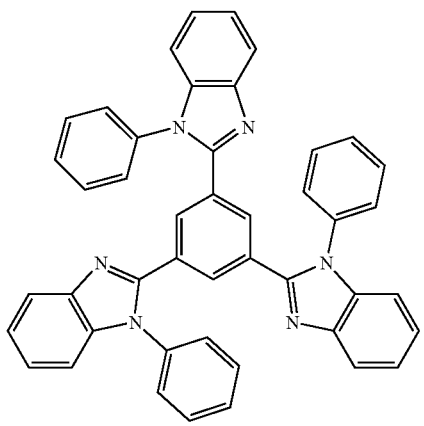

Organic compound containing imidazoles

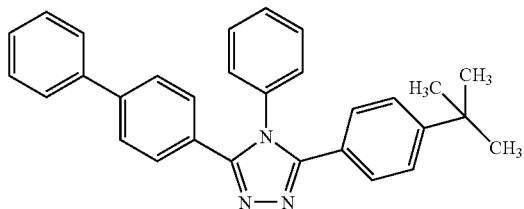

Organic compound containing triazoles

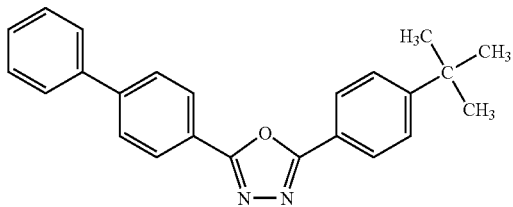

Compound containing ozxadiazoles

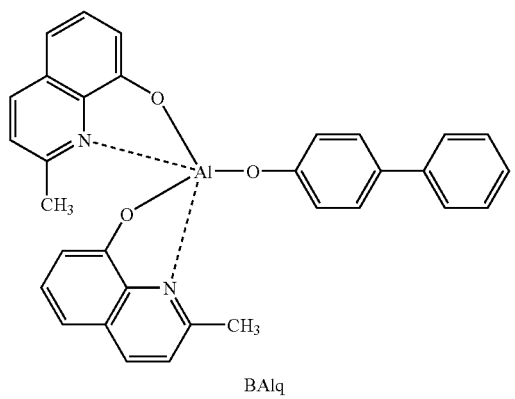

BAlq

The electron transporting layer 15 can be formed of oxazole compound, isooxazole compound, triazole compound, isothiazole compound, oxadiazole compound, thiadiazole compound, perylene compound, aluminum complex (e.g., Alq3(tris(8-quinolinolato)-aluminium), BAlq, SAlq, Almq3, gallium complex (e.g., Gaq'2OPiv, Gaq'2OAc, 2(Gaq'2)), etc.

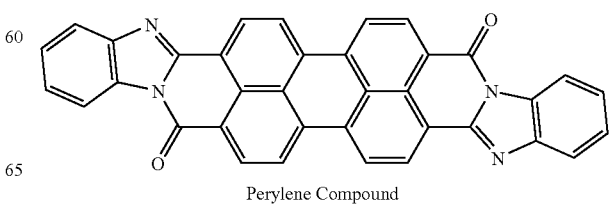

Perylene Compound

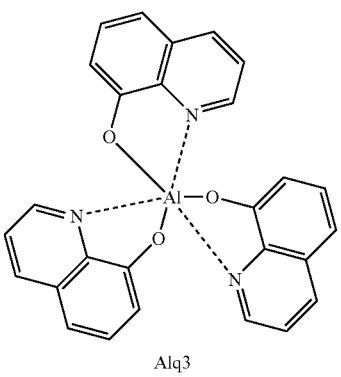
Alq3

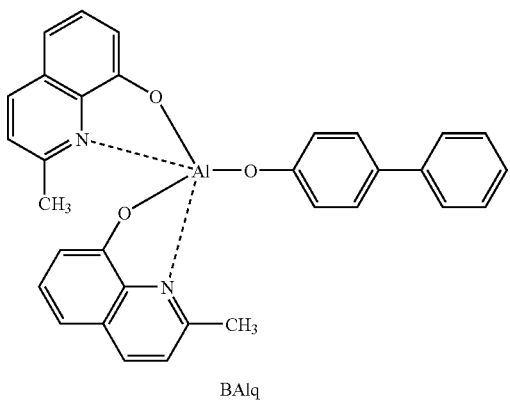
BAlq

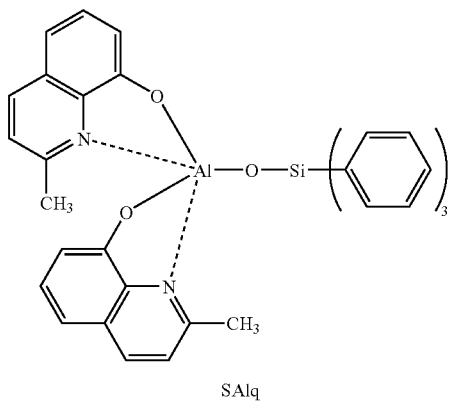
SAlq

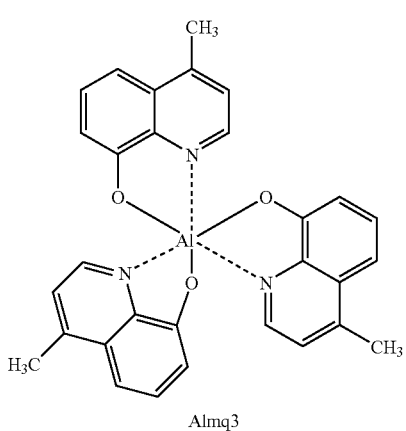
Almq3

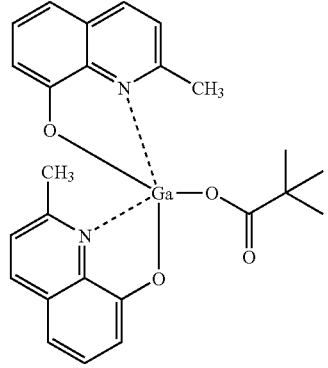
Gaq'2OPiv

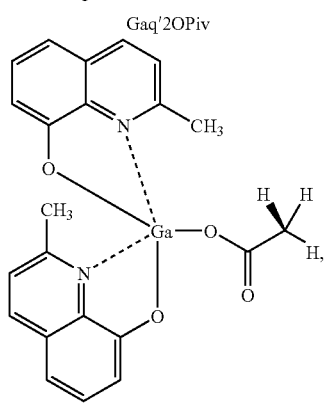
Gaq'2OAc

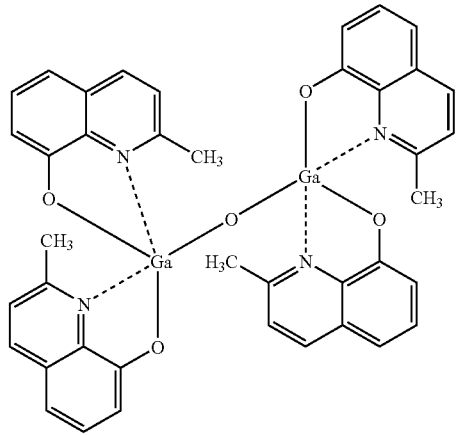
2(Gaq'2)

The thickness of the hole blocking layer may be 100 to 1,000 Å, and the thickness of the electron transporting layer may be 100 to 1,000 Å. If the thickness of the hole blocking layer and the electron transporting layer is out of this range, the electron transporting ability or the hole blocking ability is not good.

Next, a second electrode 14 is formed on the resultant layers and the resultant layers are encapsulated to complete an organic EL device.

The material for forming the second electrode 14 is not limited. Any metal having a low work function such as Li, Ca, Ca/Al, LiF/Ca, LiF/Al, Al, Mg, or Mg alloy is deposited to form the second electrode 14. The thickness of the second electrode 14 may be 50 to 3,000 Å.

The polymer of Formula 1 according to an embodiment of the present invention is used as the material for forming the emissive layer of the organic EL device, but it can be also used as the material for forming the hole transporting layer. Also, it can be used as an intermediate in biotechnology.

The organic EL device can be manufactured without any special apparatus or method, and can be manufactured using the method of manufacturing an organic EL device using conventional EL polymers.

Hereinafter, the present invention will be described in detail with reference to the following examples. The following examples are for illustrative purposes only and are not intended to limit the scope of the invention.

Example 1

Preparation of Polymer of Formulae 2A, 2B, and 2C

According to the reactions below, a polymer represented by Formulae 2A, 2B and 2C according to embodiments of the present invention is prepared.

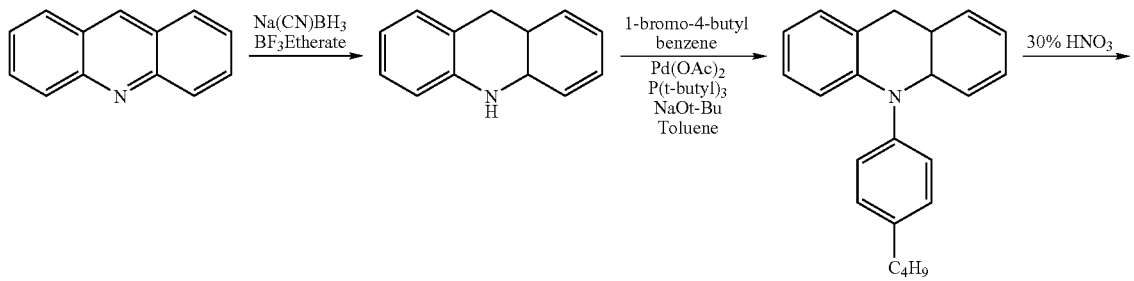

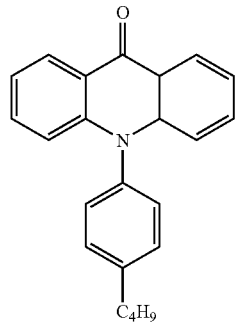

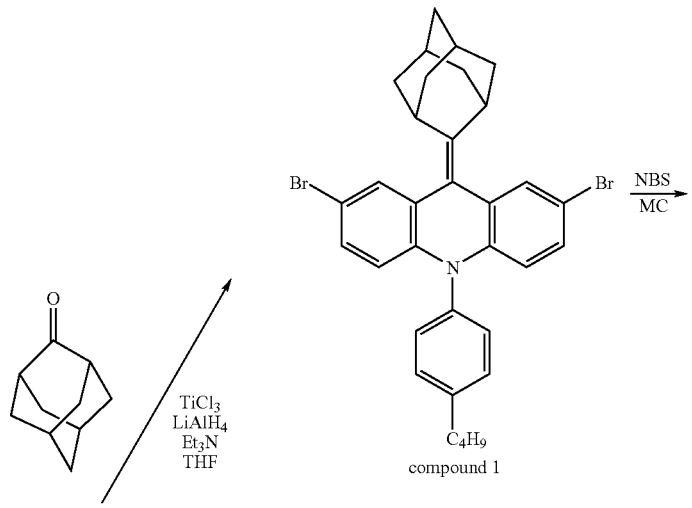

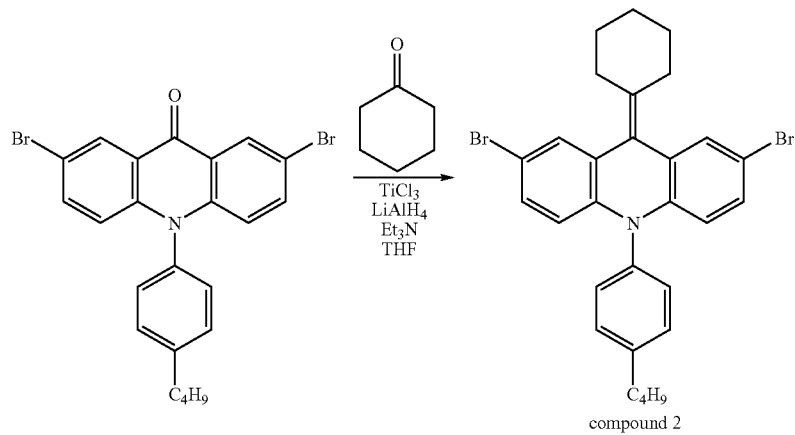
compound 2
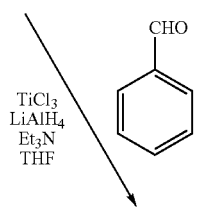
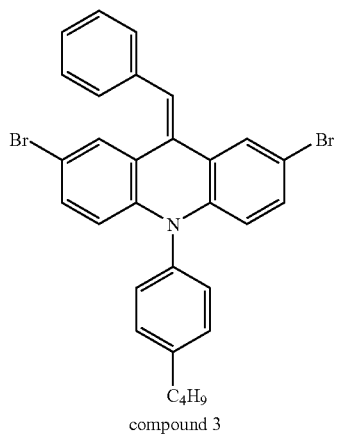
compound 3
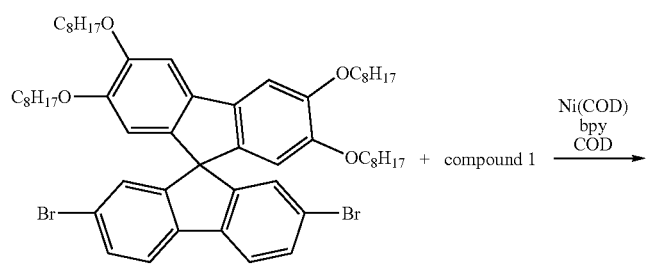

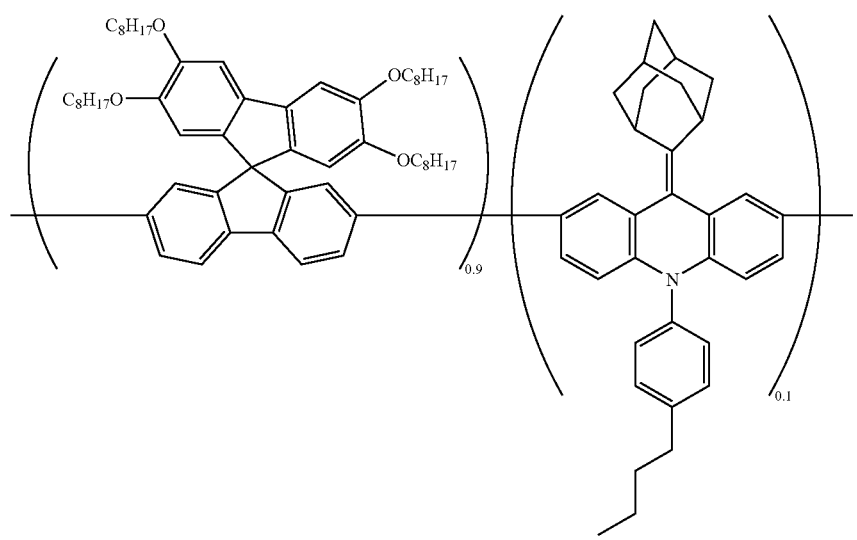
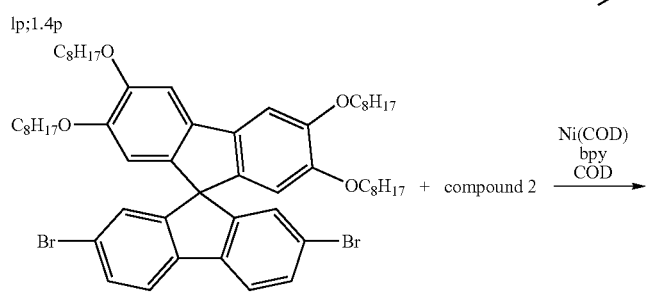
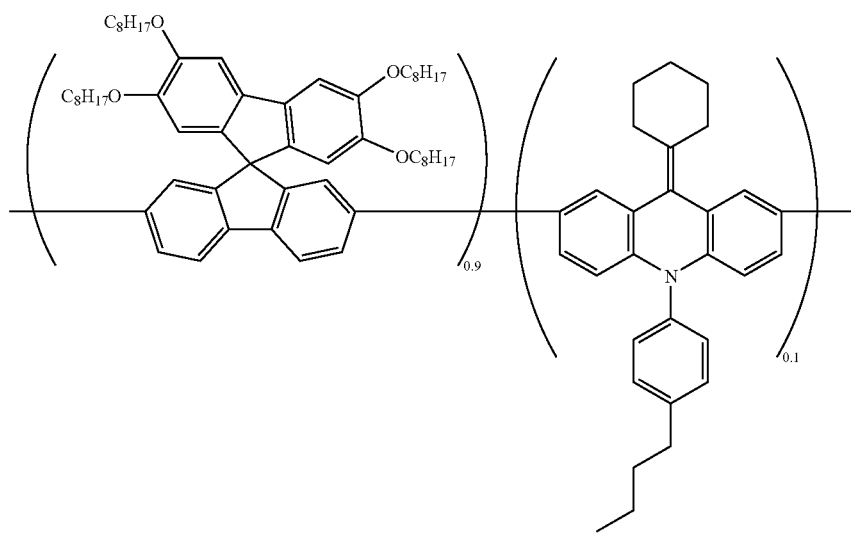
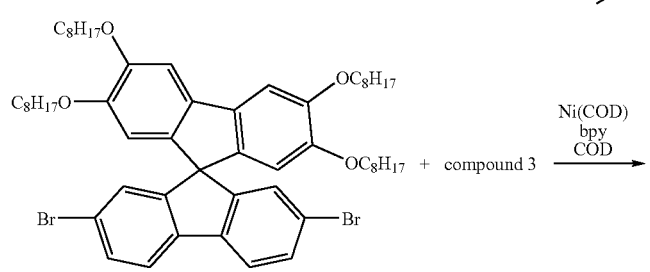

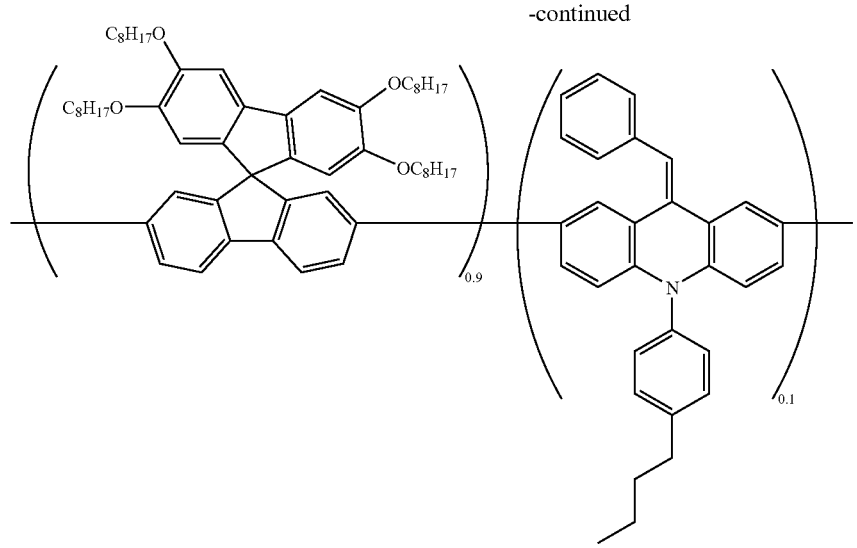

1. Synthesis of Monomer

1-1 Reduction of Acridine 45 g (0.251 mol) of acridine and 31.6 g (0.502 mol) of sodium cyano borohydride were put into a 1 L 2-neck round flask and vacuum-dried and then put to a nitrogen atmosphere. 450 ml of distilled THF was added and then 63.6 ml (0.502 mol) of borontrifluoride eterate was added and the temperature was increased to reflux and reacted for 12 hours. The reaction was checked with thin layer chromatography and the temperature was lowered in ice bath, and then 150 ml of ammonia water of 28% was slowly added to be basified and then 100 ml of sodium bicarbonate was put to extract an organic layer. Then an aqueous layer was extracted with 100 ml of ethyl acetate and the organic layer was gathered and washed with 300 ml of saline water, dried with $MgSO_4$ and filtered to condense, and then vacuum dried to obtain a product of 49 g. (Yield: over yield, yellow-green crystal, 1H NMR (300 MHz $CDCl_3$) δ 4.07 (s 2H), 6.67 (d 2H), 6.85 (t 2H), 7.07 (t 4H))

1-2. Coupling with 1-bromo-4-butylbenzne 49 g (0.251 mol) of 8a,9,10,10a-tetrahydroacridine crude product prepared in Step 1-1, 53.1 ml (0.301 mol) of 1-bromo-4-butylbenzene, 48.2 g (0.502 mol) of sodium-t-butoxide, and 3 g (0.013 mol) of palladium acetate were added together and filled with nitrogen, and then 500 ml of toluene was added and the temperature was increased by 60° C. Next, 24.2 ml (0.0502 mol) of toluene solution with 50% of tris-t-butylphosphine was added and refluxed for 1 hour. Then the reaction was checked with thin layer chromatography and the temperature was lowered to the room temperature, and 50 ml of ethyl acetate and 50 ml of water were added and agitated and filtered through a Celite pad. The remained solution was cleansed twice with 500 ml of water and then with 500 ml of saline water and dried with $MgSO_4$ and filtered to condense remaining solution. 800 ml of ether was added to the condensed remainder and suspended and agitated for 1 hour, and filtered and the product was obtained as 58.1 g of crystal. (Yield: 73.8%, light pink crystal, 1H NMR (300 MHz $CDCl_3$) δ 0.99 (t 3H), 1.42 (m 2H), 1.67 (m 2H), 2.72 (t 2H), 4.24 (s 2H), 6.22 (d 2H), 6.85 (t 2H) 6.95 (t 2H), 7.14 (d 2H), 7.21 (t 2H), 7.41 (d 2H))

1-3. Oxidization 13 g (0.0415 mol) of 10-(4-butylphenyl)-8a,9,10,10a-tetrahydroacridine prepared in Step 1-2 and 250 ml of water were put in a 1 L two-neck flask, 250 ml of nitric acid solution (60%) were added and the temperature was increased and reacted at 80° C. for 2 hours. The reaction solution was checked with thin layer chromatography and the temperature was lowered to the room temperature, and 500 ml of methylene chloride was added and agitated to extract. The liquid layer was extracted with 200 ml, 100 ml of MC (0.1 M $MgSO_4$, 0.005M $CaCl_2$) and the organic layer was gathered to basify with 500 ml of sodium bicarbonate and cleansed, and then cleansed with 500 ml of saline water and dried with $MgSO_4$ and filtered to condense remaining solution. To the condensed remainder, a small amount of MC is added and crystallized with n-hexane to obtain 4.41 g of first recrystal. The remaining solution was condensed to suspend and agitate with ether to obtain 5.43 g of second crystal. (Total 9.84 g, yield: 72.5%, yellow-green crystal, 1H NMR (300 MHz $CDCl_3$) δ 1.01 (t 3H), 1.49 (m 2H), 1.77 (m 2H), 2.86 (t 2H), 7.41 (m 4H), 7.67 (d 2H), 7.92 (t 2H) 8.13 (t 2H), 9.07 (d 2H))

1-4. Bromination 9.8 g (0.0314 mol) of 10-(4-butyl phenyl)-10,10a-dihydroacridine-9(8aH)-one prepared in Step 1-3, and 100 ml of MC were added to a 250 ml one-neck round flask and agitated. 11.2 g (0.0628 mol) of N-bromosuccineimide (NBS) was slowly added and agitated at the room temperature for 24 hours and reacted. The reaction was checked with thin layer chromatography and a portion of the solvent was condensed and 150 ml of methyl alcohol was added to suspend and agitate. The obtained solid was filtered and vacuum-dried to obtain a product of 10.39 g of 2,7-dibromo-10-(4-butylphenyl)-10,10a-dihydroacridine-9(8aH)-one. (Yield: 68.3%, yellow crystal, 1H NMR (300 MHz $CDCl_3$) δ 0.99 (t 3H), 1.43 (m 2H), 1.72 (m 2H), 2.77 (t 2H), 6.65 (d 2H), 7.49 (t 2H), 7.54 (t 2H), 8.63 (s 2H))

1-5. Synthesis of monomer

1-5-1. Synthesis of Compound 1

A 1 L two-neck round flask was vacuum-dried and put to a nitrogen atmosphere, and 4 g (20.1 mmol) of $TiCl_3$ suspension solution and 383 mg (10.1 mmol) of $LiAlH_4$ were added and agitated for 10 min. Then, 0.74 ml (10.1 mmol) of triethylamine was added and agitated for 1 hour, and 0.1 g (2.05 mmol) of 2,7-dibromon-10-(4-butylphenyl)-10,10a-dihydroacridine-9(8aH)-on and 308 mg (2.05 mmol) of 2-adamatone were added to 15 ml of THF and refluxed for 15 hours. Then, the reaction solution was diluted with water and extracted with ethyl acetate and silica gel column was separated. (Yield: 45%, light yellow powder, 1H NMR (300 MHz $CDCl_3$) δ 0.99 (t 3H), 1.43 (m 3H), 1.77 (m 3H), 1.95 (m 14H), 2.77 (t 2H), 6.32 (d 2H), 7.49 (t 2H), 7.54 (t 2H), 7.65 (s 2H))

1-5-2. Synthesis of Compound 2

A 1 L two-neck round flask was vacuum-dried and put to a nitrogen atmosphere, and 4 g (20.1 mmol) of $TiCl_3$ suspension and 383 mg (10.1 mmol) of $LiAlH_4$ were put and agitated for 10 min. Then, 0.74 ml (10.1 mmol) of triethylamine was put and agitated for 1 hour, and 0.1 g (2.05 mmol) of 2,7-dibromon-10-(4-butylphenyl)-10,10a-dihydroacridine-9 (8aH)-one and 201 mg (2.05 mmol) of cyclohexanone were put to 15 ml of THF and refluxed for 15 hours. Then, the reaction solution was diluted with water and extracted with ethyl acetate and separated by silica gel column. (Yield: 40%, light yellow powder, 1H NMR (300 MHz $CDCl_3$) δ 0.99 (t 3H), 1.43 (m 8H), 1.62 (d 2H), 2.77 (t 2H), 6.28 (d 2H), 7.50 (t 2H), 7.43 (t 2H), 7.75 (s 2H))

1-5-3 Synthesis of Compound 3

A 1 L two-neck round flask was vacuum-dried and put to a nitrogen atmosphere, and 4 g (20.1 mmol) of $TiCl_3$ suspension solution and 383 mg (10.1 mmol) of $LiAlH_4$ were added and agitated for 10 min. Then, 0.74 ml (10.1 mmol) of triethylamine was added and agitated for 1 hour, and 0.1 g (2.05 mmol) of 2,7-dibromo-10-(4-butylphenyl)-10,10a-dihydroacridine-9(8aH)-one and 210 mg (2.05 mmol) of benzaldehyde were added to 15 ml of THF and refluxed for 15 hours. Then, the reaction solution was diluted with water and extracted with ethyl acetate and separated by silica gel column. (Yield: 50%, light yellow powder, 1H NMR (300 MHz $CDCl_3$) δ 0.99 (t 3H), 1.45 (m 2H), 1.752 (m 2H), 2.55 (t 2H), 6.32 (d 2H), 7.35 (t 2H), 7.70 (t 2H), 7.85 (s 2H))

1-6. Synthesis of EL Polymer

1-6-1 EL Polymer of Example 1-a

A Schlenk flask was fully evacuated and refluxed with nitrogen gas to completely remove moisture, and then 880 mg (3.2 mmol) of bis(1,5-cyclooctadiene)nickel(O) (hereinafter referred to as "Ni(COD)") and 500 mg (3.2 mmol) of bipyridal were charged in a glove box. The flask was evacuated again several times and refluxed with nitrogen gas. 10 ml of anhydrous dimethylfurane (DMF), 346 mg (3.2 mmol) of 1,5-cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 96.5 mg (0.16 mmol) of Compound 1 in 10 ml of toluene was added to the mixture.

Next, the materials on the walls of the flask were cleansed by adding 10 ml of toluene and agitated at 80° C. for 4 days. After the agitation was completed, the temperature of the reaction mixture was dropped to 60° C. and the reaction mixture was poured into a 1:1:2 mixture of HCl, acetone, and methanol to precipitate. The precipitates were dissolved in chloroform, reprecipitated in methanol, and subjected to soxhlet extraction to give 450 mg of polymer represented by Formula 2A where n is 100.

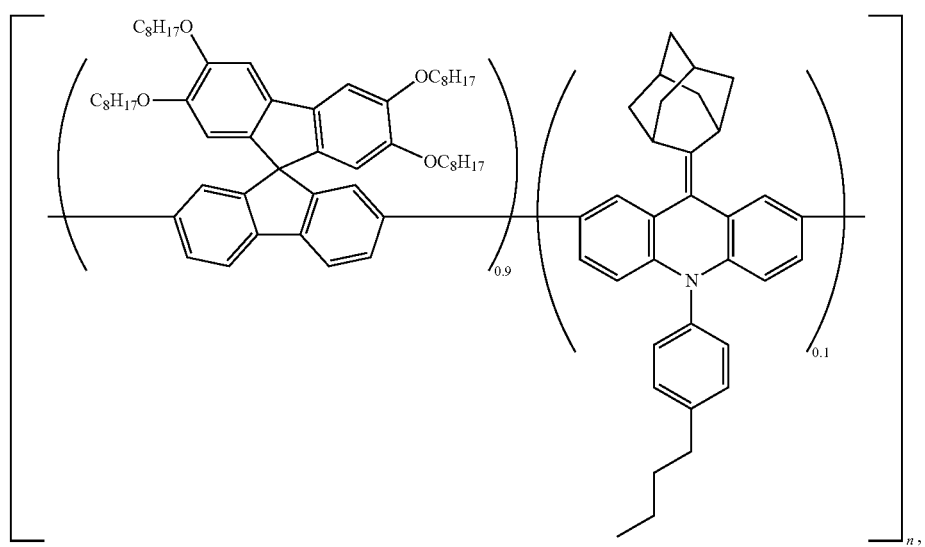

[Formula 2A]

where n is 100.

1-6-2 EL Polymer of Example 1-b

A Schlenk flask was fully evacuated and refluxed with nitrogen gas to completely remove moisture, and then 880 mg (3.2 mmol) of Ni(COD) and 500 mg (3.2 mmol) of bipyridal were charged in a glove box. The flask was evacuated again several times and refluxed with nitrogen gas. 10 ml of anhydrous dimethylfurane (DMF), 346 mg (3.2 mmol) of 1,5- cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 90 mg (0.16 mmol) of Compound 2 in 10 ml of toluene was added to the mixture.

Next, the materials on the walls (of the flask?) were cleansed by adding 10 ml of toluene and agitated at 80° C. for 4 days. After the agitation was completed, the temperature of the reaction mixture was dropped to 60° C. and the reaction mixture was poured into a 1:1:2 mixture of HCl, acetone, and methanol to precipitate. The precipitates were dissolved in chloroform, reprecipitated in methanol, and subjected to soxhlet extraction to give 480 mg of polymer represented by Formula 2B.

were charged in a glove box. The flask was evacuated again and refluxed with nitrogen gas. 10 ml of anhydrous dimethylfurane (DMF), 346 mg (3.2 mmol) of 1,5-cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 97 mg (0.16 mmol) of Compound 3 in 10 ml of toluene was added to the mixture.

Next, the materials on the walls of the flask were cleansed by adding 10 ml of toluene and agitated at 80° C. for 4 days. After the agitation was completed, the temperature of the reaction mixture was dropped to 60° C. and the reaction

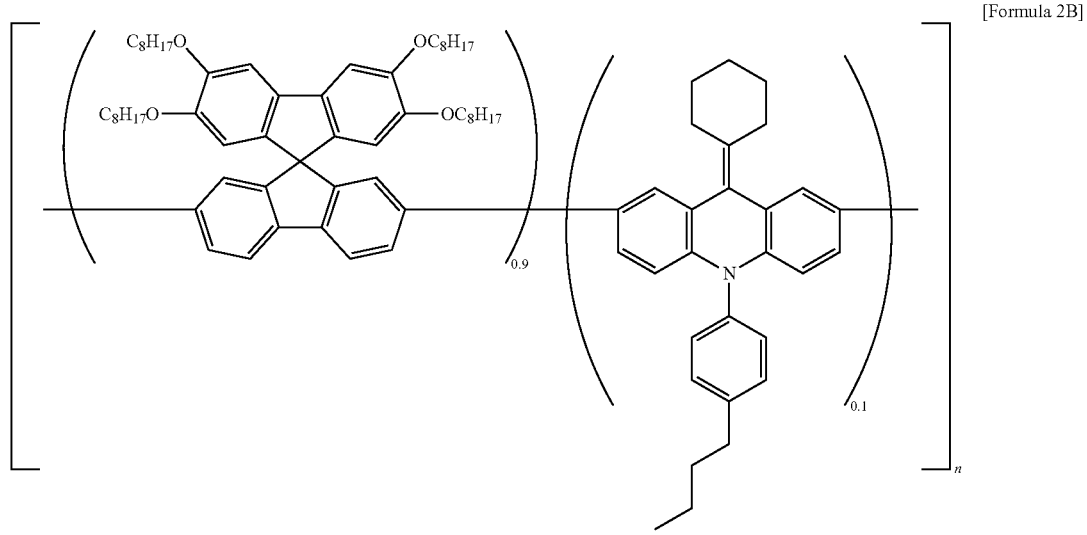

[Formula 2B]

1-6-3 EL Polymer of Example 1-c

A Schlenk flask was fully evacuated and refluxed with nitrogen gas to completely remove moisture, and then 880 mg (3.2 mmol) of Ni(COD) and 500 mg (3.2 mmol) of bipyridal mixture was poured into a 1:1:2 mixture of HCl, acetone, and methanol to precipitate. The precipitates were dissolved in chloroform, reprecipitated in methanol, and subjected to soxhlet extraction to give 470 mg of polymer represented by Formula 2C.

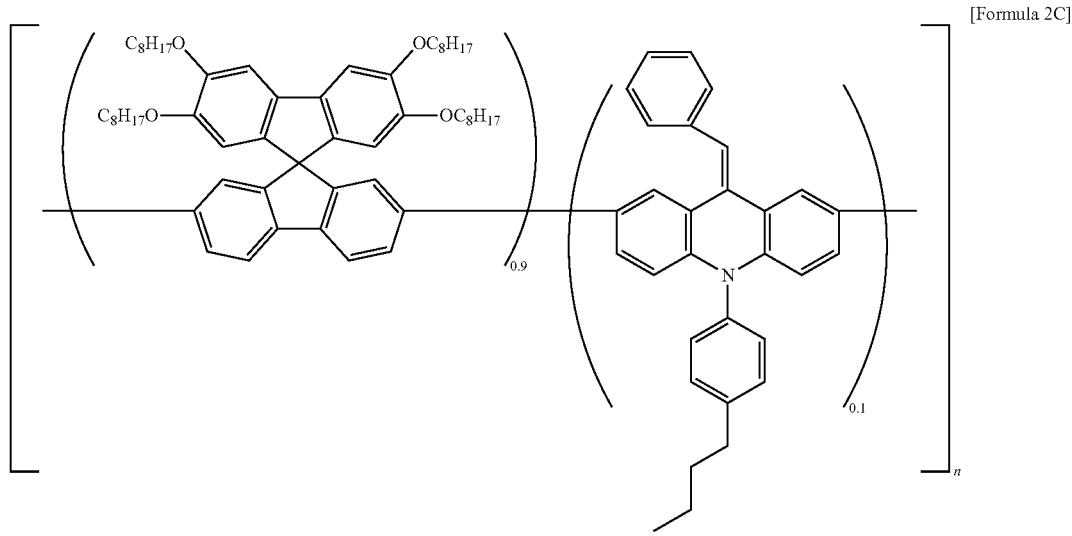

[Formula 2C]

Example 2

Preparation of Polymer of Formula 3

The polymer as represented by Formula 3 is prepared according to the reaction below.

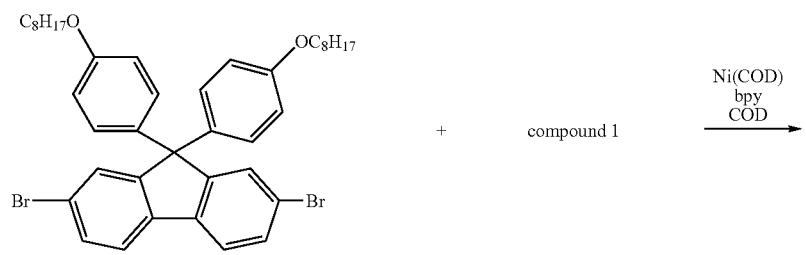

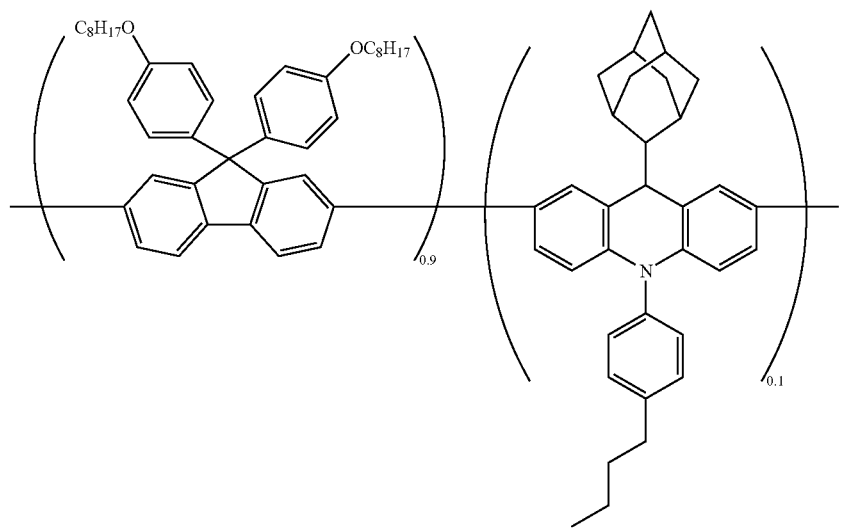

A Schlenk flask was fully evacuated and refluxed with nitrogen gas to completely remove moisture, and then 880 mg (3.2 mmol) of Ni(COD) and 500 mg (3.2 mmol) of bipyridal were charged in a glove box. The flask was evacuated again and refluxed with nitrogen gas. 10 ml of anhydrous dimethylfurane (DMF), 346 mg (3.2 mmol) of 1,5-cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 97 mg (0.16 mmol) of Compound 1 in 10 ml of toluene was added to the mixture.

Next, the materials on the walls of the flask were cleansed by adding 10 ml of toluene and agitated at 80° C. for 4 days. After the agitation was completed, the temperature of the reaction mixture was dropped to 60° C. and the reaction mixture was poured into a 1:1:2 mixture of HCl, acetone, and methanol to precipitate. The precipitates were dissolved in chloroform, reprecipitated in methanol, and subjected to soxhlet extraction to give 480 mg of polymer.

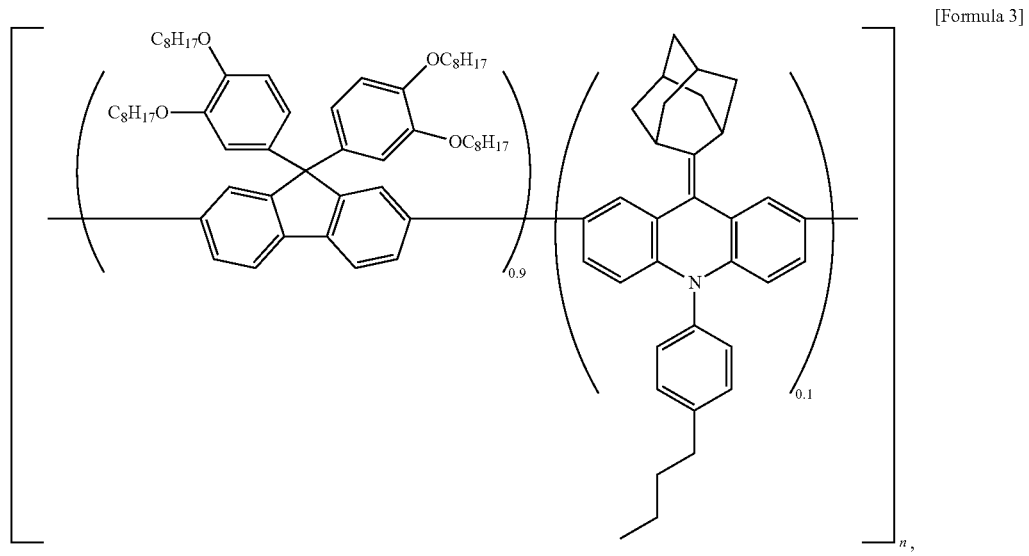

[Formula 3]

where n is 92.

Comparative Example 1

Preparation of Polymer of Formula 4 in the Prior Art

According to the reaction below, a polymer represented by Formula 4 in the prior art is prepared.

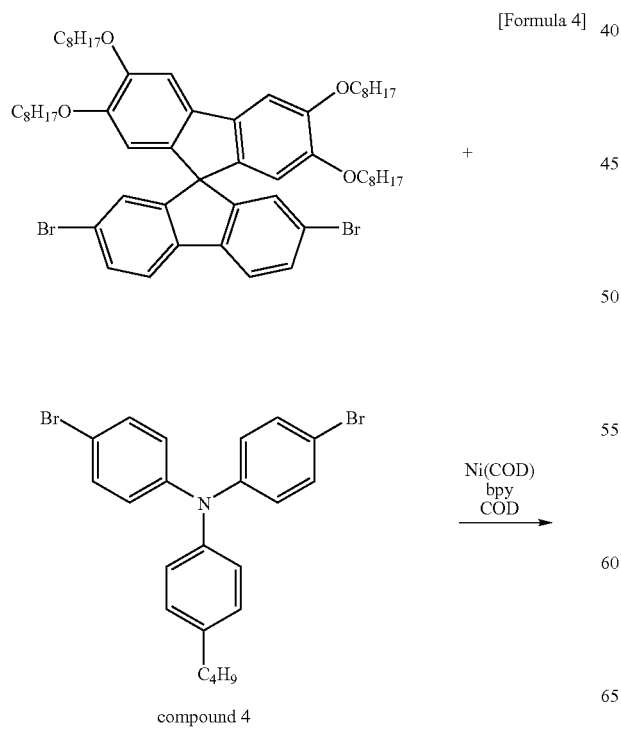

[Formula 4]

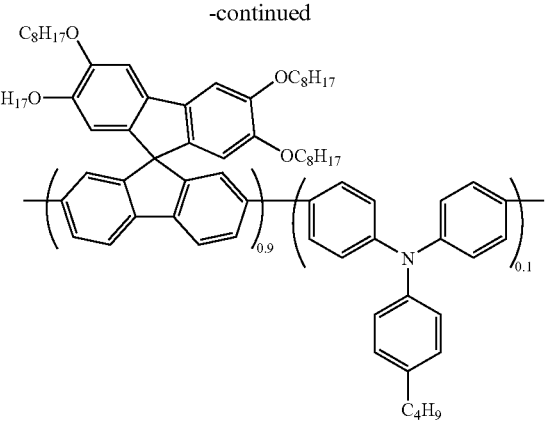

A Schlenk flask was fully evacuated and refluxed with nitrogen gas to completely remove moisture, and then 880 mg (3.2 mmol) of Ni(COD) and 500 mg (3.2 mmol) of bipyridal were charged in a glove box. The flask was evacuated again and refluxed with nitrogen gas. 10 ml of anhydrous dimethylfurane (DMF), 346 mg (3.2 mmol) of 1,5-cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 80 mg (0.16 mmol) of Compound 4 in 10 ml of toluene was added to the mixture.

Next, the materials on the walls of the flask were cleansed by adding 10 ml of toluene and agitated at 80° C. for 4 days. After the agitation was completed, the temperature of the reaction mixture was dropped to 60° C. and the reaction mixture was poured into a 1:1:2 mixture of HCl, acetone, and methanol to precipitate. The precipitates were dissolved in chloroform, reprecipitated in methanol, and subjected to soxhlet extraction to give 390 mg of polymer as represented by Formula 4.

[Formula 4]

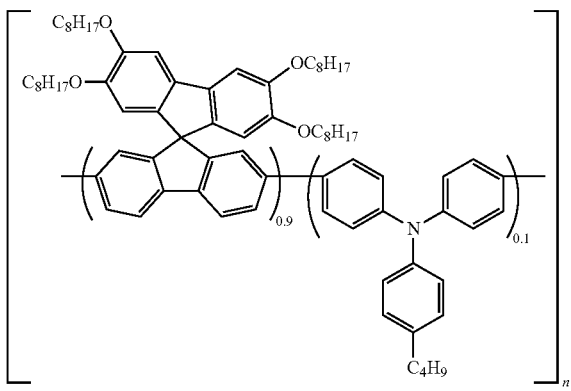

where n is 105.

Comparative Example 2

Preparation of Polymer of Formula 5 in the Prior Art

According to the equation below, a polymer represented by Formula 5 in the prior art is prepared.

A Schlenk flask was fully evacuated and refluxed with nitrogen gas to completely remove moisture, and then 880 mg (3.2 mmol) of bis(1,5-cyclooctadiene)nickel(O) (hereinafter referred to as "Ni(COD)") and 500 mg (3.2 mmol) of bipyridal were charged in a glove box. The flask was evacuated again several times and refluxed with nitrogen gas. 10 ml of anhydrous dimethylfurane (DMF), 346 mg (3.2 mmol) of 1,5-cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 124 mg (0.16 mmol) of Compound 5 in 10 ml of toluene was added to the mixture.

Next, the materials on the walls of the flask were cleansed by adding 10 ml of toluene and agitated at 80° C. for 4 days. After the agitation was completed, the temperature of the reaction mixture was dropped to 60° C. and the reaction mixture was poured into a 1:1:2 mixture of HCl, acetone, and methanol to precipitate. The precipitates were dissolved in chloroform, reprecipitated in methanol, and subjected to soxhlet extraction to give 520 mg of polymer as represented by Formula 5.

[Formula 5]

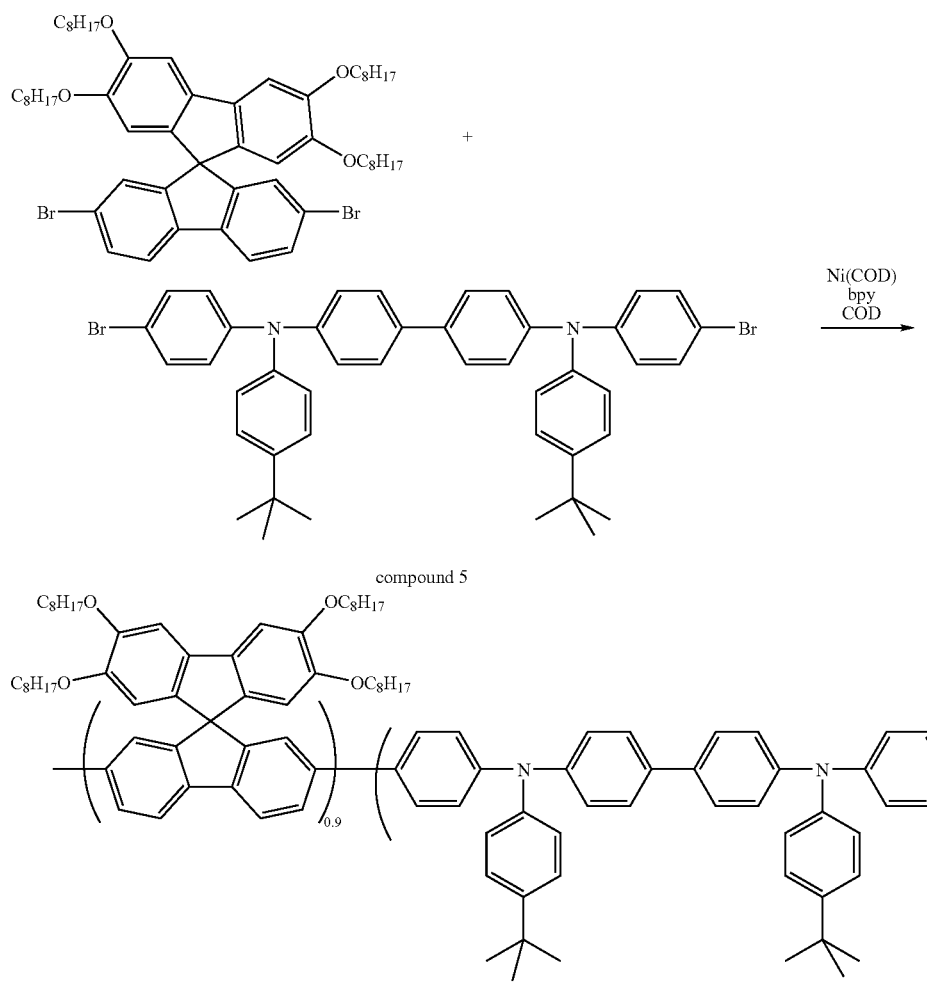

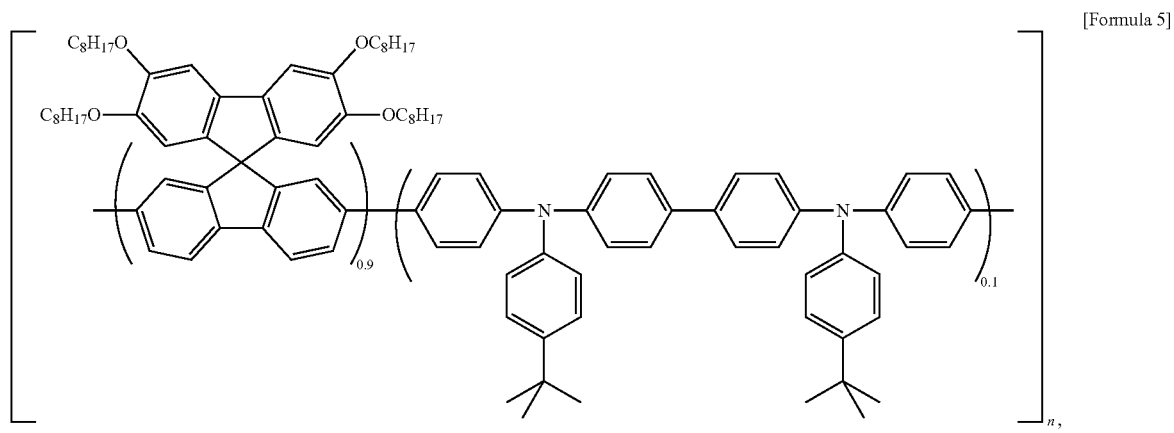

where n is 105.

Comparative Example 3

Preparation of Polymer of Formula 6 in the Prior Art

According to the reaction below, a polymer represented by Formula 6 in the prior art is prepared.

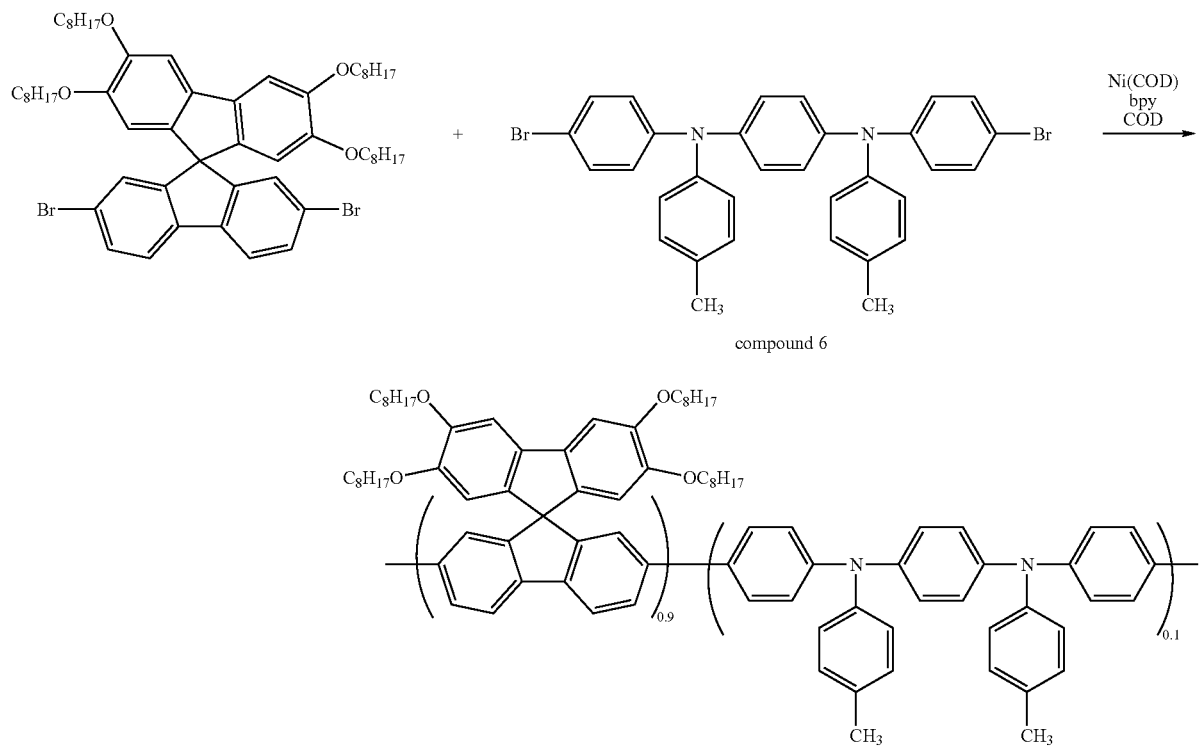

A Schlenk flask was fully evacuated and refluxed with nitrogen gas to completely remove moisture, and then 880 mg (3.2 mmol) of Ni(COD) and 500 mg (3.2 mmol) of bipyridal were charged in a glove box. The flask was evacuated again several times and refluxed with nitrogen gas. 10 ml of anhydrous dimethylfurane (DMF), 346 mg (3.2 mmol) of 1,5-cyclooctadiene (COD), and 10 ml of anhydrous toluene were added to the flask under nitrogen atmosphere. The reaction mixture was agitated at 80° C. for 30 min., and a diluted solution of 1.05 g (1.44 mmol) of 2,7-dibromo-2',3',6',7'-tetraoctyloxy spirofluorene and 96 mg (0.16 mmol) of Compound 6 in 10 ml of toluene was added to the mixture.

Next, the materials on the walls of the flask were cleansed by adding 10 ml of toluene and agitated at 80° C. for 4 days.

After the agitation was completed, the temperature of the reaction mixture was dropped to 60° C. and the reaction mixture was poured into a 1:1:2 mixture of HCl, acetone, and methanol to precipitate. The precipitates were dissolved in chloroform, reprecipitated in methanol, and subjected to soxhlet extraction to give 400 mg of polymer as represented by Formula 6.

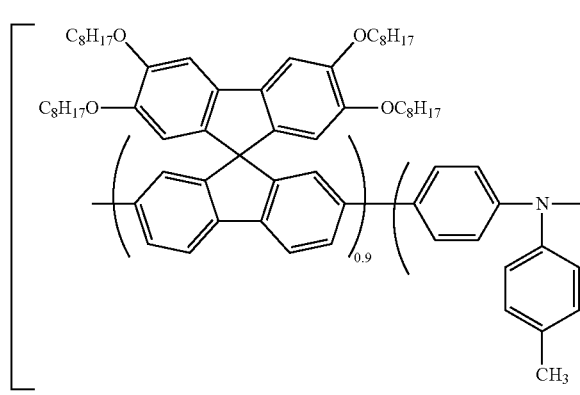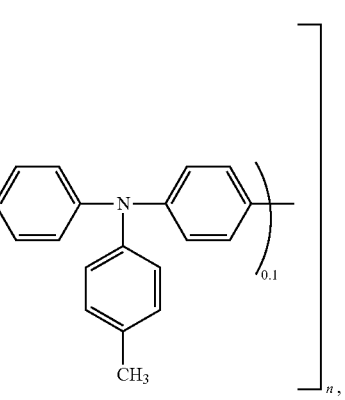

[Formula 6]

where n is 110.

Figure 2:
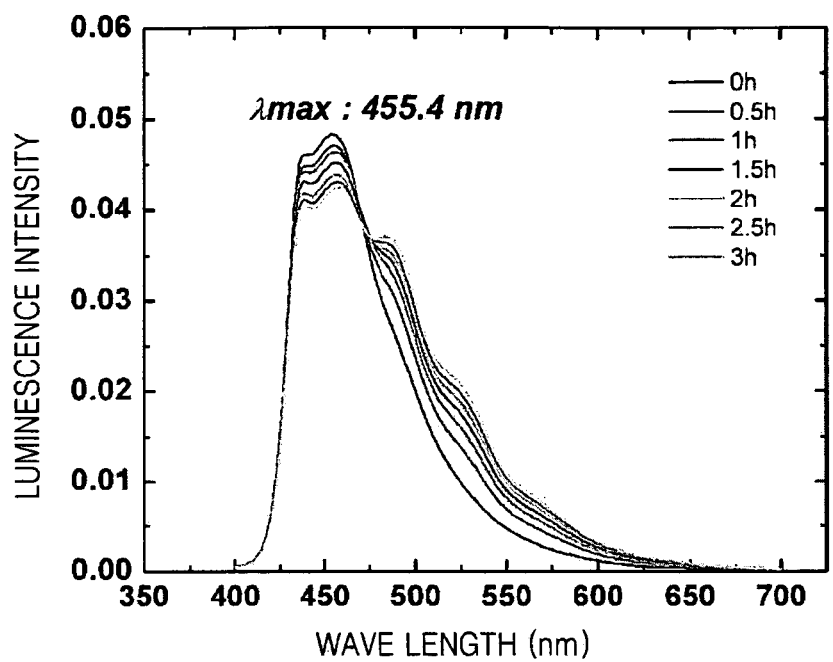
FIGS. 2 and 3 are graphs illustrating the photochemical stability of polymers according to embodiments of the present invention.
Figure 3:
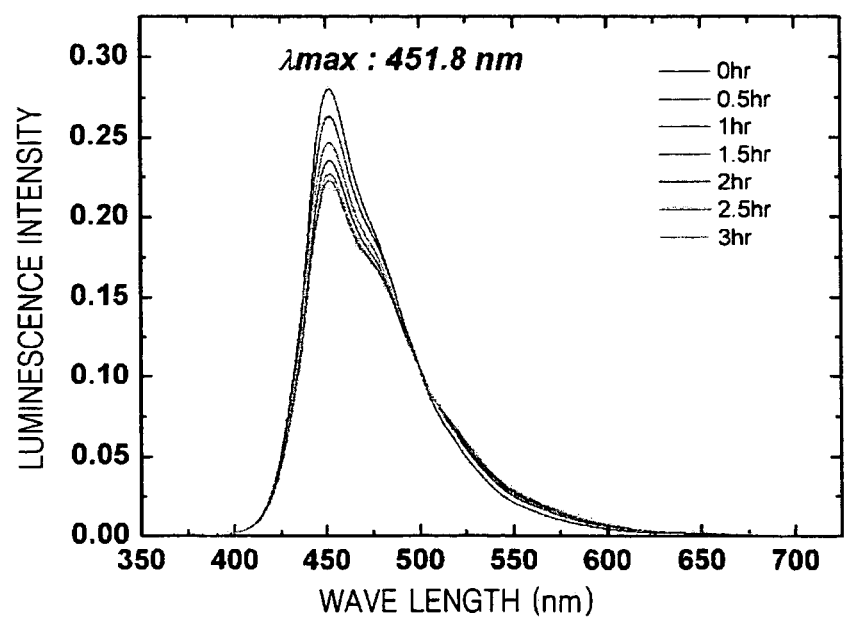

FIGS. 2 and 3 are graphs illustrating the photochemical stability of the polymers of Formulas 2 and 3 prepared in Examples 1-a and 2, showing the stability of the EL spectrum of each wavelength according to time.

Fabrication Example 1

Fabrication of Organic EL Device According to an Embodiment of the Present Invention An organic EL device was fabricated using the polymer prepared in Example 1-a.

First, a transparent electrode substrate coated with indium-tin oxide (ITO) on its glass substrate was cleansed and ITO was patterned into a desired shape using a photosensitive resin and etchant and cleansed thoroughly again. PEDOT{poly(3,4-ethylenedioxythiophene)} was coated thereon as a hole injection layer to a thickness of 50 nm, and was baked at 110° C. for 1 hour. Next, a composition for forming an emissive layer of 0.8 weight % of the polymer prepared in Example 1-a dissolved in 99.2 weight % of m-xylene was spin-coated on the buffer layer and baked, and the solvent was completely removed in a vacuum oven to form a polymer thin layer. The polymer solution was filtered through a 0.45 μm before being spin-coated, and the thickness of the polymer thin layer is adjusted to be about 80 nm by controlling the density of the polymer solution and the spin speed.

Next, a Ca layer to a thickness of 2.7 nm and an Al layer were sequentially deposited on the EL polymer thin layer using a vacuum evaporator while maintaining the vacuum degree at $4\times10^{-6}$ torr or less. The thickness of the thin layer and the layer grown at speed during the deposition were adjusted using a crystal sensor.

Fabrication Example 2

Fabrication of Organic EL Device According to an Embodiment of the Present Invention An organic EL device was fabricated using the polymer prepared in Example 1-a.

The organic EL device was fabricated in the same manner as in Fabrication Example 1, except that a PFB layer (poly(fluorene-co-PDA)) was stacked as an intermediate layer to a thickness of 10 nm on the PEDOT{poly(3,4-ethylenedioxythiophene)} layer.

Fabrication Example 3

Fabrication of Organic EL Device According to an Embodiment of the Present Invention An organic EL device was fabricated using the polymer prepared in Example 2.

The organic EL device was fabricated in the same manner as in Fabrication Example 1, except that the polymer prepared in Example 2 was used instead of the polymer prepared in Example 1-a.

Fabrication Example 4

Fabrication of Organic EL Device According to an Embodiment of the Present Invention An organic EL device was fabricated using the polymer prepared in Example 2.

The organic EL device was fabricated in the same manner as in Fabrication Example 3, except that an H5 layer (poly(spirofluorene-co-phenoxazine)) was stacked as an intermediate layer to a thickness of 10 nm on the PEDOT{poly(3,4-ethylenedioxythiophene)} layer.

Fabrication Example 5

Fabrication of Organic EL Device According to an Embodiment of the Present Invention An organic EL device was fabricated using the polymer prepared in Example 2.

The organic EL device was fabricated in the same manner as in Fabrication Example 3, except that a BFE layer (poly(fluorene-co-TPD)) was stacked as an intermediate layer to a thickness of 10 nm on the PEDOT{poly(3,4-ethylenedioxythiophene)} layer.

Comparative Fabrication Example 1

Fabrication of Organic EL Device

An organic EL device was fabricated using the polymer prepared in Comparative Example 1.

The organic EL device was fabricated in the same manner as in Fabrication Example 1, except that the polymer prepared in Comparative Example 1 was used instead of the polymer prepared in Example 1-a.

Comparative Fabrication Example 2

Fabrication of Organic EL Device

An organic EL device was fabricated using the polymer prepared in Comparative Example 2.

The organic EL device was fabricated in the same manner as in Fabrication Example 1, except that the polymer prepared in Comparative Example 2 was used instead of the polymer prepared in Example 1-a.

Comparative Fabrication Example 3

Fabrication of Organic EL Device

An organic EL device was fabricated using the polymer prepared in Comparative Example 2.

The organic EL device was fabricated in the same manner as in Comparative Fabrication Example 2, except that a PFB layer was stacked as an intermediate layer to a thickness of 10 nm on the PEDOT{poly(3,4-ethylenedioxythiophene)} layer.

Comparative Fabrication Example 4

Fabrication of Organic EL Device

An organic EL device was fabricated using the polymer prepared in Comparative Example 3.

The organic EL device was fabricated in the same manner as in Fabrication Example 1, except that the polymer prepared in Comparative Example 3 was used instead of the polymer prepared in Example 1-a.

Comparative Fabrication Example 5

Fabrication of Organic EL Device

An organic EL device was fabricated using the polymer prepared in Comparative Example 3.

The organic EL device was fabricated in the same manner as in Comparative Fabrication Example 4, except that a PFB layer was stacked as an intermediate layer to a thickness of 10 nm on the PEDOT{poly(3,4-ethylenedioxythiophene)} layer.

Table 1 below exhibits the device characteristics and the lifetime of the organic EL layers manufactured according to Fabrication Examples 1 through 10.

For measurement purposes, a D.C. current forward bias voltage was used as the turn-on voltage, and each device realized characteristics of a typical rectifying diode. Particularly, the devices including the polymer of Examples 1-a and 2 showed good color purity and color stability, good efficiency and brightness.

According to the present invention, a blue EL polymer having high color purity and color stability is provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polymer as represented by Formula 1 below:

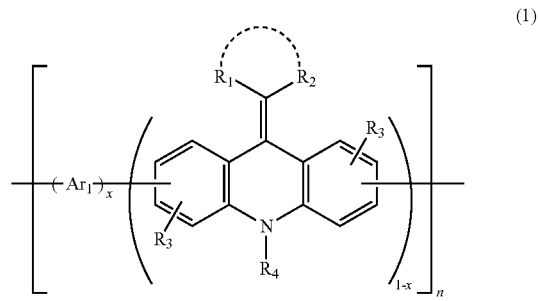

(1)

where x is from 0.001 to 0.99;

n is from 10 to 150;

$Ar_1$ is a material selected from the group consisting of a substituted or unsubstituted C6-C30 arylene group, a substituted or unsubstituted C2-C30 heteroarylene group, a substituted or unsubstituted C2-C30 hetero ring group, and a substituted or unsubstituted C2-C30 vinylene group;

$R_1$ and $R_2$ are each independently H, a substituted or unsubstituted C1-C20 alkyl group, a substituted or unsubstituted C6-C30 aryl group, a substituted or unsubstituted C4-C20 cycloalkyl group, or a substituted or unsubstituted C1-C20 alkoxy group, and R1 and R2 can be connected to each other to form a ring;

TABLE 1

| EL polymer | Intermediate layer | Device characteristics | | | |
|---|---|---|---|---|---|
| | | Maximum efficiency(cd/A) | Color coordinate (x, y) @800 nit | Turn-on voltage (V) | Lifetime time @800 nit |
| Example 1-a | — | 2.06 | 0.15, 0.12 | 3.4 | 13.2 |
| Example 1-a | PFB | 3.13 | 0.15, 0.16 | 3.2 | 37.5 |
| Example 2 | — | 1.1 | 0.15, 0.11 | 3.0 | — |
| Example 2 | H5 | 2.1 | 0.16, 0.25 | 3.0 | — |
| Example 2 | BFE | 2.5 | 0.15, 0.13 | 3.0 | — |
| Comparative Example 1 | — | 1.0* | 0.15, 0.09* | 3.3* | 10* |
| Comparative Example 2 | — | 1.55 | 0.16, 0.16 | 4.6 | 4.0 |
| Comparative Example 2 | PFB | 1.38 | 0.18, 0.18 | 4.6 | 9.2 |
| Comparative Example 3 | — | 3.92 | 0.16, 0.26 | 3.4 | 60 |
| Comparative Example 3 | PFB | 5.46 | 0.16, 0.26 | 3.2 | 70 |

*@100 nit $R_3$ is H, an alkyl group, an alkoxy group, an ester group, a cyano group, an aryl group, a heteroaryl group, a cyclic group, a heterocyclic group, or a fused aromatic group; and $R_4$ is a material selected from the group consisting of H, an alkyl group, an alkoxy group, an ester group, a substituted or unsubstituted C6-C30 aryl group, a substituted or unsubstituted C2-C30 heteroaryl group, a substituted or unsubstituted C2-C30 hetero ring group, a fused aromatic group, and a triphenylamine derivative.

2. The polymer of claim 1, wherein $Ar_1$ of Formula 1 is one of Formulas 1A through 1R:

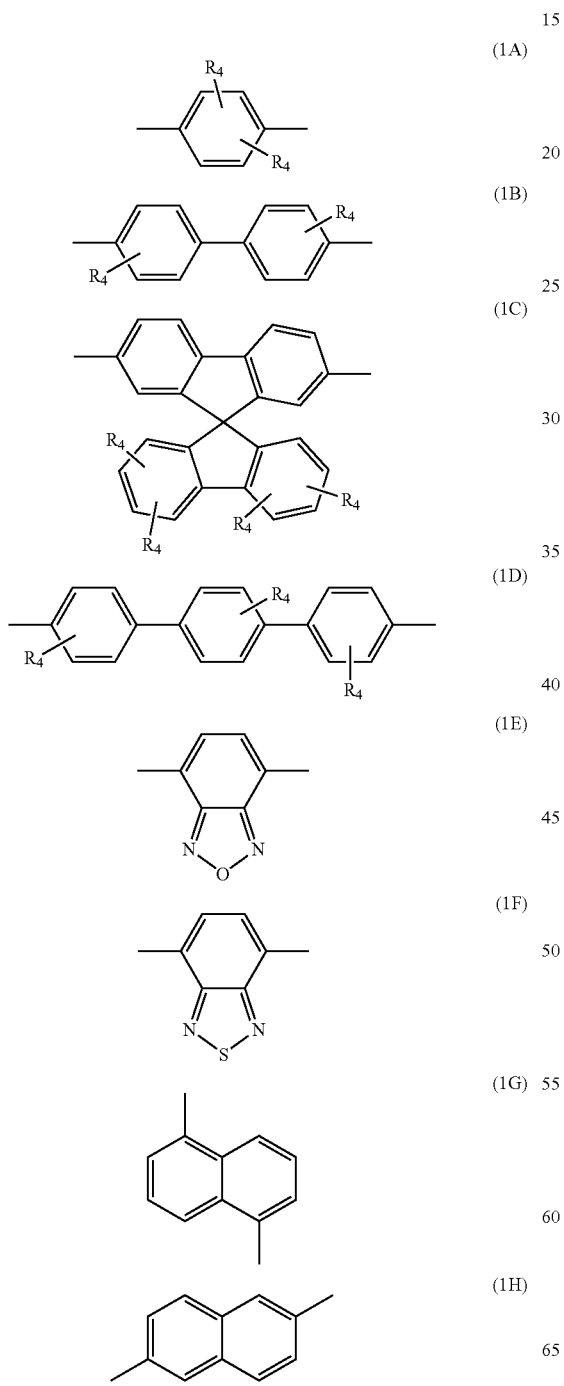
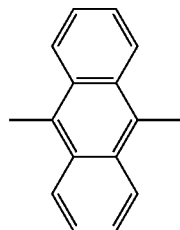
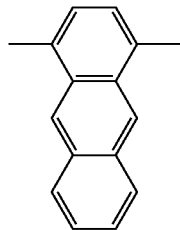
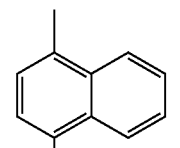
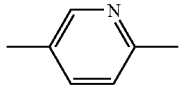
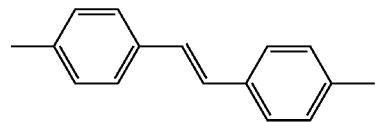
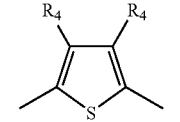
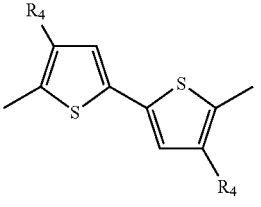
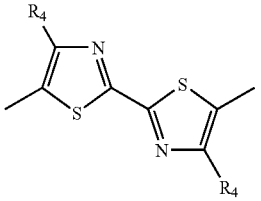
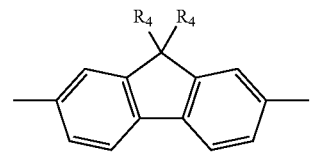

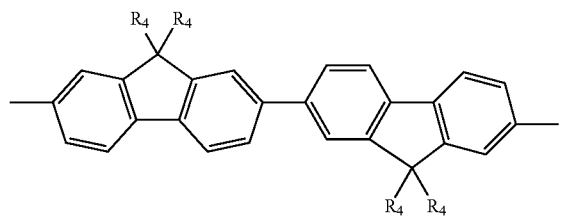

where $R_4$ of Formulas 1A through 1R is selected from the group consisting of a C1-C12 alkyl group, an alkoxy group, and a substituted or unsubstituted C6-C30 aryl group.

3. The polymer of claim 2, wherein $Ar_1$ of Formula 1 is one of Formula 1C and Formula 1Q.

4. The polymer of claim 1, wherein $R_1$ and $R_2$ are connected to form a substituted or unsubstituted cycloalkyl C6-C20 group.

5. The polymer of claim 1, wherein $R_1$ and $R_2$ are connected to form a ring including a hetero atom.

6. The polymer of claim 1, wherein the polymer is represented by Formula 2A:

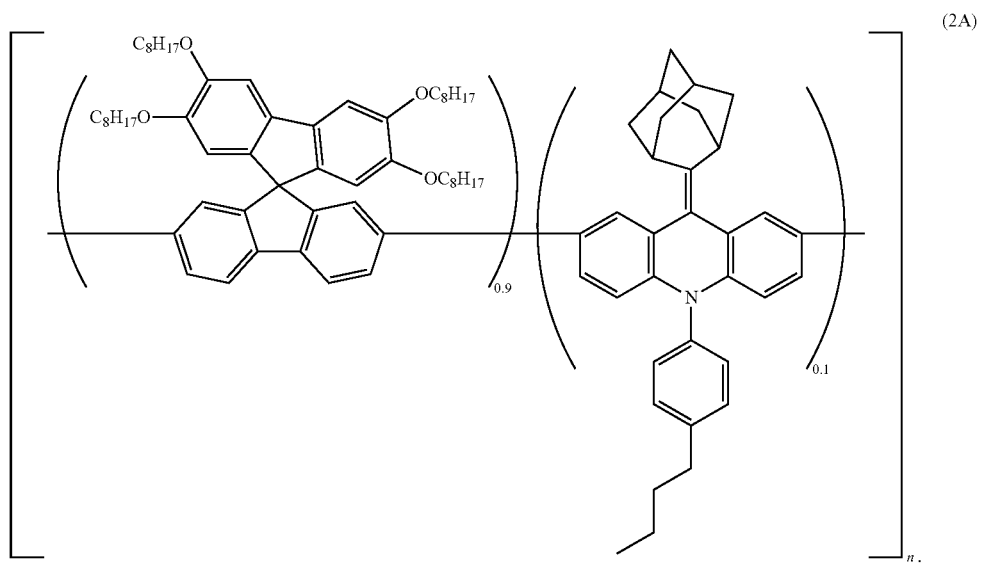

7. The polymer of claim 1, wherein the polymer is represented by Formula 2B:

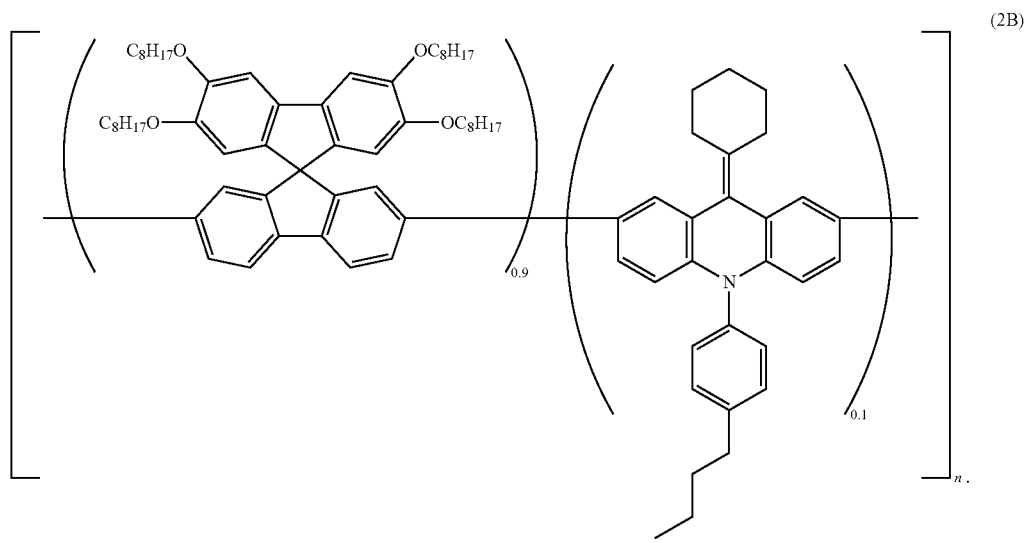

8. The polymer of claim 1, wherein the polymer is represented by Formula 2C:

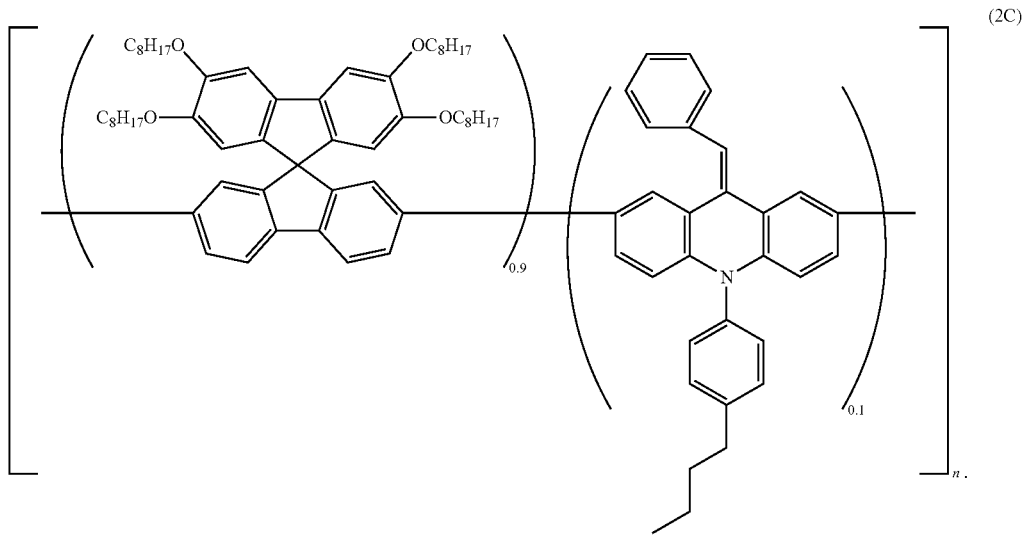

9. The polymer of claim 1, wherein the polymer is represented by Formula 3:

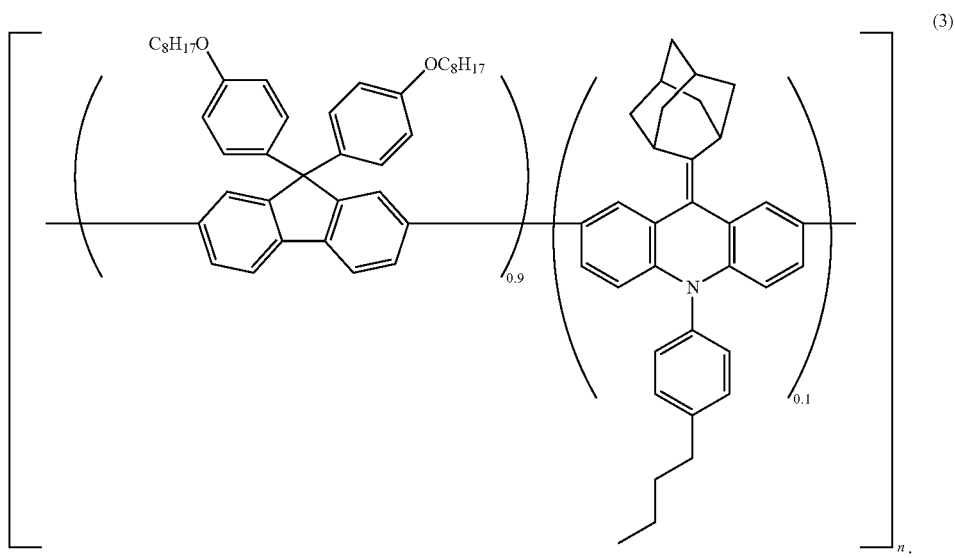

10. An organic EL device comprising an organic layer formed of the polymer of claim 1.

11. An organic EL device, comprising:
a pair of electrodes; and
an organic layer between the pair of electrodes, the organic layer comprising a polymer represented by Formula 1;

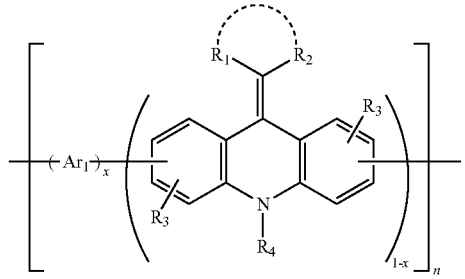

where x is from 0.001 to 0.99;
n is from 10 to 150;
$Ar_1$ is a material selected from the group consisting of a substituted or unsubstituted C6-C30 arylene group, a substituted or unsubstituted C2-C30 heteroarylene group, a substituted or unsubstituted C2-C30 hetero ring group, and a substituted or unsubstituted C2-C30 vinylene group;
$R_1$ and $R_2$ are each independently H, a substituted or unsubstituted C1-C20 alkyl group, a substituted or unsubstituted C6-C30 aryl group, a substituted or unsubstituted C4-C20 cycloalkyl group, or a substituted or unsubstituted C1-C20 alkoxy group, and R1 and R2 can be connected to each other to form a ring;
$R_3$ is H, an alkyl group, an alkoxy group, an ester group, a cyano group, an aryl group, a heteroaryl group, a cyclic group, a heterocyclic group, or a fused aromatic group; and R₄ is a material selected from the group consisting of H, an alkyl group, an alkoxy group, an ester group, a substituted or unsubstituted C6-C30 aryl group, a substituted or unsubstituted C2-C30 heteroaryl group, a substituted or unsubstituted C2-C30 hetero ring group, a fused aromatic group, and a triphenylamine derivative.

12. The organic EL device of claim 11, wherein the organic layer is at least one of an emissive layer and a hole transporting layer.

13. The organic EL device of claim 11, wherein Ar₁ of Formula 1 is one of Formulas 1A through 1R:

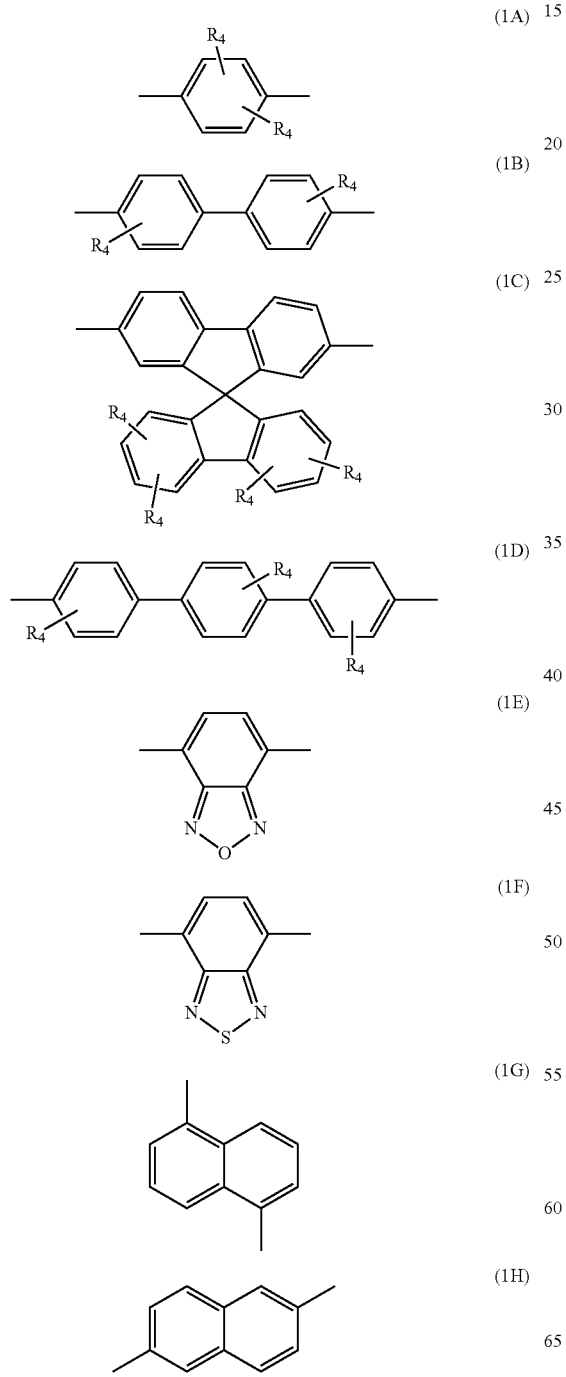

-continued

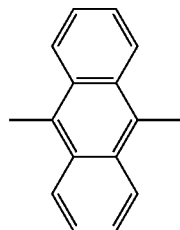

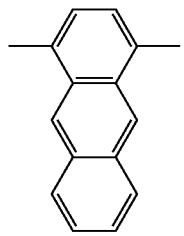

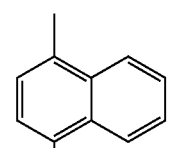

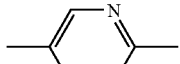

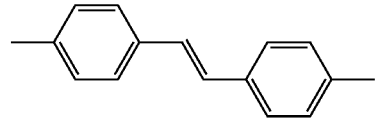

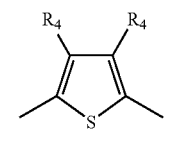

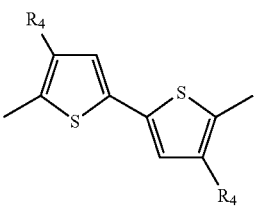

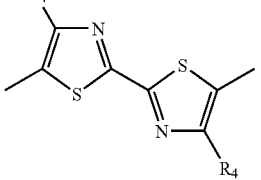

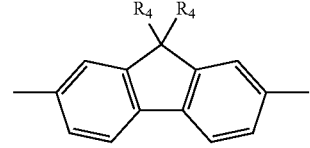

-continued

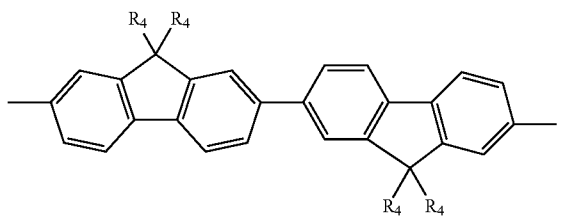
(1R)

where $R_4$ of Formulas 1A through 1R is selected from the group consisting of a C1-C12 alkyl group, an alkoxy group, and a substituted or unsubstituted C6-C30 aryl group.

14. The organic EL device of claim 13, wherein $Ar_1$ of Formula 1 is one of Formula 1C and Formula 1Q.

15. The organic EL device of claim of claim 11, wherein $R_1$ and $R_2$ are connected to form a substituted or unsubstituted cycloalkyl C6-C20 group.

16. The organic EL device of claim 11, wherein $R_1$ and $R_2$ are connected to form a ring including a hetero atom.

17. The organic EL device of claim 11, wherein the polymer is represented by one of Formulae 2A, 2B, 2C and 3:

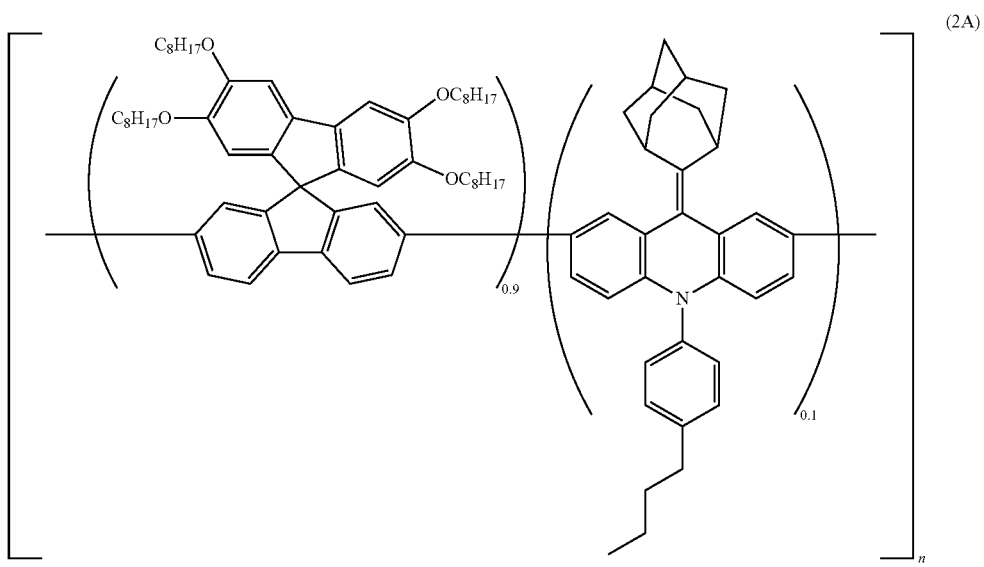
(2A)

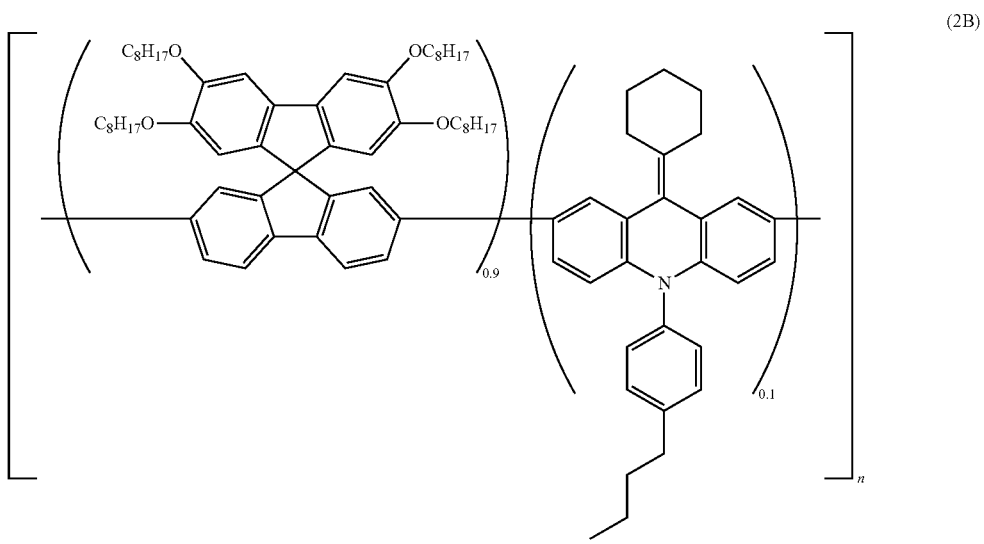
(2B)

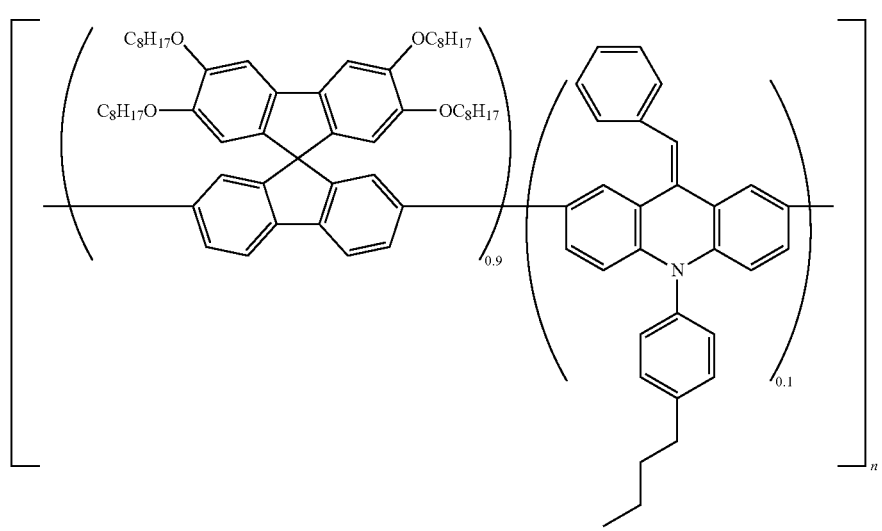

(2C)

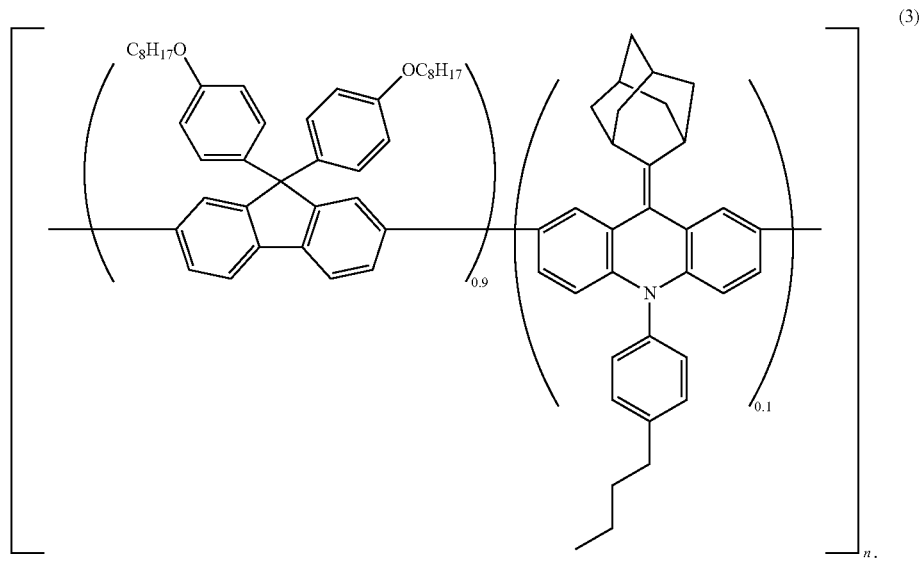

(3)

18. An organic EL device, comprising:
a first electrode;
a second electrode; and
an organic layer comprising an emissive layer between the first electrode and the second electrode, the emissive layer comprising a polymer represented by Formula 1:

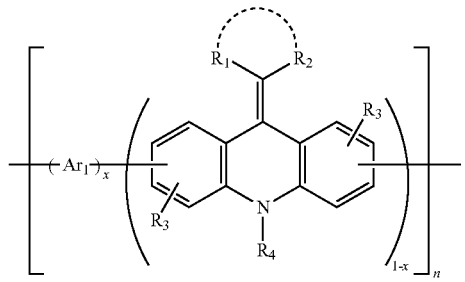

(1)

where x is from 0.001 to 0.99;
n is from 10 to 150;
$Ar_1$ is a material selected from the group consisting of a substituted or unsubstituted C6-C30 arylene group, a substituted or unsubstituted C2-C30 heteroarylene group, a substituted or unsubstituted C2-C30 hetero ring group, and a substituted or unsubstituted C2-C30 vinylene group;
$R_1$ and $R_2$ are each independently H, a substituted or unsubstituted C1-C20 alkyl group, a substituted or unsubstituted C6-C30 aryl group, a substituted or unsubstituted C4-C20 cycloalkyl group, or a substituted or unsubstituted C1-C20 alkoxy group, and R1 and R2 can be connected to each other to form a ring;
$R_3$ is H, an alkyl group, an alkoxy group, an ester group, a cyano group, an aryl group, a heteroaryl group, a cyclic group, a heterocyclic group, or a fused aromatic group; and $R_4$ is a material selected from the group consisting of H, an alkyl group, an alkoxy group, an ester group, a substituted or unsubstituted C6-C30 aryl group, a substituted or unsubstituted C2-C30 heteroaryl group, a substituted or unsubstituted C2-C30 hetero ring group, a fused aromatic group, and a triphenylamine derivative.

19. The organic EL device of claim 18, wherein the weight average molecular weight of the polymer is 1,000 to 2,000,000.

20. The organic EL device of claim 18, wherein the molecular weight distribution of the polymer is 1 to 5.

* * * * *